US012581992B2

(12) United States Patent
Tanaka

(10) Patent No.: US 12,581,992 B2
(45) Date of Patent: Mar. 17, 2026

(54) INSULATION MODULE AND GATE DRIVER

(71) Applicant: ROHM CO., LTD., Kyoto (JP)

(72) Inventor: Bungo Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 392 days.

(21) Appl. No.: 18/453,315

(22) Filed: Aug. 22, 2023

(65) Prior Publication Data

US 2023/0395454 A1 Dec. 7, 2023

Related U.S. Application Data

(63) Continuation of application No. PCT/JP2022/006044, filed on Feb. 16, 2022.

(30) Foreign Application Priority Data

Feb. 25, 2021 (JP) ................................. 2021-028463

(51) Int. Cl.
*H01L 25/18* (2023.01)
*H01L 23/31* (2006.01)
(Continued)

(52) U.S. Cl.
CPC .......... *H01L 23/3192* (2013.01); *H01L 25/18* (2013.01); *H10D 86/85* (2025.01);
(Continued)

(58) Field of Classification Search
CPC ... H01L 23/3192; H01L 25/18; H01L 23/291; H01L 23/293; H01L 24/05; H01L 24/06;
(Continued)

(56) References Cited

U.S. PATENT DOCUMENTS 6,133,880 A 10/2000 Grangeat et al.
6,714,666 B1 3/2004 Morimura et al.
(Continued)

FOREIGN PATENT DOCUMENTS

CN 111919298 A 11/2020
DE 10036911 A1 2/2002
(Continued)

OTHER PUBLICATIONS

International Search Report and Written Opinion mailed on Apr. 26, 2022, received for PCT Application PCT/JP2022/006044, filed on Feb. 16, 2022, 10 pages including English Translation.
(Continued)

*Primary Examiner* — Afroza Chowdhury
(74) *Attorney, Agent, or Firm* — XSENSUS LLP

(57) ABSTRACT

This insulation module is provided with: a first conductor and a second conductor, which are buried in an insulating layer so as to face each other at a distance in the thickness direction of the insulating layer; a first electrode which is connected to the first conductor; a second electrode which is connected to the second conductor, while being arranged at a position that is away from the first electrode when viewed from the thickness direction of the insulating layer; a passivation layer which is formed on the surface of the insulating layer; a low dielectric constant layer which is formed on the surface of the passivation layer, and has a lower dielectric constant than the passivation layer; and a mold resin which covers the low dielectric constant layer.

15 Claims, 17 Drawing Sheets

(51) Int. Cl.
H10D 86/85 (2025.01)
*H01L 23/00* (2006.01)
*H01L 23/29* (2006.01)

(52) U.S. Cl.
CPC .......... *H01L 23/291* (2013.01); *H01L 23/293* (2013.01); *H01L 24/05* (2013.01); *H01L 24/06* (2013.01); *H01L 24/32* (2013.01); *H01L 24/45* (2013.01); *H01L 24/48* (2013.01); *H01L 24/49* (2013.01); *H01L 24/73* (2013.01); *H01L 2224/05554* (2013.01); *H01L 2224/05567* (2013.01); *H01L 2224/06152* (2013.01); *H01L 2224/32245* (2013.01); *H01L 2224/45124* (2013.01); *H01L 2224/45144* (2013.01); *H01L 2224/45147* (2013.01); *H01L 2224/48137* (2013.01); *H01L 2224/48245* (2013.01); *H01L 2224/49175* (2013.01); *H01L 2224/73265* (2013.01)

(58) Field of Classification Search
CPC ......... H01L 24/32; H01L 24/45; H01L 24/48; H01L 24/49; H01L 24/73; H01L 2224/05554; H01L 2224/05567; H01L 2224/06152; H01L 2224/32245; H01L 2224/45124; H01L 2224/45144; H01L 2224/45147; H01L 2224/48137; H01L 2224/48245; H01L 2224/49175; H01L 2224/73265; H01F 2019/085
See application file for complete search history.

(56) References Cited

U.S. PATENT DOCUMENTS

| | | | |
|---|---|---|---|
| 2003/0134475 A1 | 7/2003 | Hofmann et al. | |
| 2004/0097037 A1 | 5/2004 | Hofmann et al. | |
| 2009/0052214 A1 | 2/2009 | Edo et al. | |
| 2015/0137314 A1 | 5/2015 | Osada et al. | |
| 2017/0236856 A1* | 8/2017 | Tomiyasu | H10D 84/0126 |
| | | | 378/91 |
| 2017/0287624 A1 | 10/2017 | Osada et al. | |
| 2018/0130587 A1* | 5/2018 | Tanaka | H01F 17/0013 |
| 2020/0014375 A1* | 1/2020 | Arimura | H03K 19/20 |
| 2020/0203058 A1 | 6/2020 | Osada et al. | |
| 2021/0043361 A1 | 2/2021 | Osada | |
| 2021/0233700 A1 | 7/2021 | Osada et al. | |

FOREIGN PATENT DOCUMENTS

| | | |
|---|---|---|
| DE | 69821327 T2 | 11/2004 |
| DE | 60032286 T2 | 5/2007 |
| JP | 2009-049035 A | 3/2009 |
| JP | 2016-028407 A | 2/2016 |
| JP | 2018078169 A | 5/2018 |
| JP | 2020010422 A | 1/2020 |

OTHER PUBLICATIONS

Office Action dated Aug. 26, 2025 in corresponding Japanese patent application No. 2023-502309 (10 pages; with English translation). German Office Action issued Aug. 20, 2024 in corresponding German Patent Application No. 11 2022 000 711.7, 17 pages.

* cited by examiner

INSULATION MODULE AND GATE DRIVER

This application is a continuation of PCT Application No. PCT/JP2022/006044, filed on Feb. 16, 2022, which claims priority to Japan Patent Application No. 2021-028463, filed on Feb. 25, 2021, the entire contents of each of which are incorporated herein by reference.

BACKGROUND

The present disclosure relates to an insulation module and a gate driver.

An insulation transformer known in the prior art includes a primary coil and a secondary coil that are opposed to each other with an insulation layer interposed between the primary coil and the secondary coil (refer to, for example, JP 2009-49035 A1).

DETAILED DESCRIPTION

Embodiments of a gate driver will be described below with reference to the drawings. The embodiments described below exemplify configurations and methods for embodying a technical concept and are not intended to limit the material, shape, structure, layout, dimensions, and the like of each component to those described below.

First Embodiment

Figure 1:
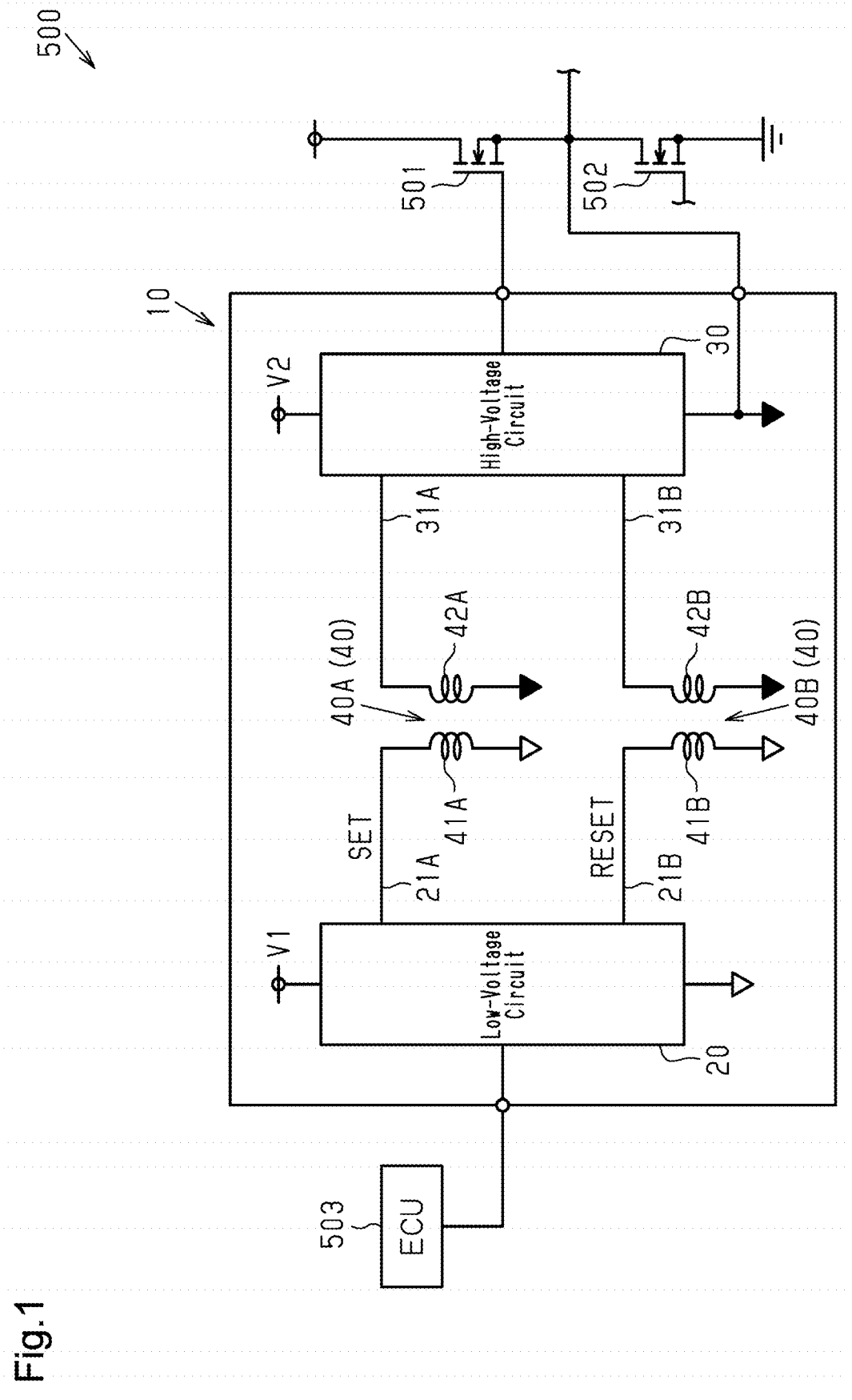
FIG. 1 is a schematic circuit diagram showing a first embodiment of a gate driver.

A first embodiment of a gate driver 10 will be described with reference to FIGS. 1 to 9. FIG. 1 schematically shows an example of a circuit configuration of the gate driver 10.

As shown in FIG. 1, the gate driver 10 is configured to apply a drive voltage signal to the gate of a switching element. In an example, the gate driver 10 is used in an inverter device 500 mounted on an electric vehicle or a hybrid electric vehicle. The inverter device 500 includes two switching elements 501 and 502 connected in series to each other, the gate driver 10, and an electronic control unit 503 (ECU) that controls the gate driver 10. In an example, the switching element 501 is a high-side switching element connected to a drive power supply. The switching element 502 is a low-side switching element. Examples of the switching elements 501 and 502 include transistors such as a Si metal-oxide-semiconductor field-effect transistor (Si MOSFET), a SiC MOSFET, and an insulated gate bipolar transistor (IGBT). The gate driver 10 of the present embodiment applies a drive voltage signal to the gate of the switching element 501. In the description hereafter, SiC MOSFETs are used in the switching elements 501 and 502.

The gate driver 10 is provided for each of the switching elements 501 and 502 and separately drives the switching elements 501 and 502. In the present embodiment, the gate driver 10 that drives the switching element 501 will be described for the sake of convenience. The gate driver 10 includes a low-voltage circuit 20 to which a first voltage V1 is applied, a high-voltage circuit 30 to which a second voltage V2 is applied, and transformers 40 disposed between the low-voltage circuit 20 and the high-voltage circuit 30. The second voltage V2 is higher than the first voltage V1. More specifically, the low-voltage circuit 20 and the high-voltage circuit 30 are connected by the transformers 40. The first voltage V1 and the second voltage V2 are direct current voltages.

The gate driver 10 of the present embodiment is configured, based on a control signal from the ECU 503, to transmit a signal from the low-voltage circuit 20 to the high-voltage circuit 30 through the transformers 40 and to output a drive voltage signal from the high-voltage circuit 30.

The signal transmitted from the low-voltage circuit 20 toward the high-voltage circuit 30, that is, a signal output from the low-voltage circuit 20, is, for example, for driving the switching element 501. Examples of the signal include a set signal and a reset signal. The set signal transmits a rising edge of the control signal from the ECU 503. The reset signal transmits a falling edge of the control signal from the ECU 503. In other words, the set signal and the reset signal are signals for generating a drive voltage signal of the switching element 501. The set signal and the reset signal correspond to a "first signal."

More specifically, the low-voltage circuit 20 is configured to be actuated by application of the first voltage V1. The low-voltage circuit 20 is electrically connected to the ECU 503 and generates a set signal and a reset signal based on a control signal received from the ECU 503. In an example, the low-voltage circuit 20 generates the set signal in response to a rising edge of the control signal and generates the reset signal in response to a falling edge of the control signal. The low-voltage circuit 20 transmits the generated set signal and reset signal toward the high-voltage circuit 30.

The high-voltage circuit 30 is configured to be actuated by application of the second voltage V2. The high-voltage circuit 30 is electrically connected to the gate of the switching element 501. Based on the set signal and the reset signal received from the low-voltage circuit 20, the high-voltage circuit 30 generates a drive voltage signal for driving the switching element 501 and applies the drive voltage signal to the gate of the switching element 501. In other words, the high-voltage circuit 30 generates a drive voltage signal that is applied to the gate of the switching element 501 based on the first signal output from the low-voltage circuit 20. More specifically, the high-voltage circuit 30 generates a drive voltage signal for activating the switching element 501 based on the set signal and applies the drive voltage signal to the gate of the switching element 501. The high-voltage circuit 30 generates a drive voltage signal for deactivating the switching element 501 based on the reset signal and applies the drive voltage signal to the gate of the switching element 501. Thus, the gate driver 10 controls the activation and deactivation of the switching element 501.

The high-voltage circuit 30 includes, for example, an R-S flip-flop circuit, into which a set signal and a reset signal are input, and a driver unit. The driver unit generates a drive voltage signal based on an output signal of the R-S flip-flop circuit. However, the high-voltage circuit 30 may be changed to any specific circuit configuration.

In the gate driver 10 of the present embodiment, the low-voltage circuit 20 and the high-voltage circuit 30 are insulated from each other by the transformers 40. More specifically, the transformers 40 restrict transmission of a direct current voltage between the low-voltage circuit 20 and the high-voltage circuit 30 while allowing transmission of various signals such as the set signal and the reset signal.

Thus, a state in which the low-voltage circuit 20 and the high-voltage circuit 30 are insulated from each other refers to a state in which transmission of a direct current voltage between the low-voltage circuit 20 and the high-voltage circuit 30 is interrupted, while transmission of a signal between the low-voltage circuit 20 and the high-voltage circuit 30 is allowed.

The insulation voltage of the gate driver 10 is, for example, greater than or equal to 2500 Vrms and less than or equal to 7500 Vrms. In the present embodiment, the insulation voltage of the gate driver 10 is approximately 5000 Vrms. However, the insulation voltage of the gate driver 10 is not limited to these values and may be any specific numerical value.

In the present embodiment, the ground of the low-voltage circuit 20 and the ground of the high-voltage circuit 30 are arranged independently. In the description hereafter, the ground potential of the low-voltage circuit 20 is referred to as a first reference potential, and the ground potential of the high-voltage circuit 30 is referred to as a second reference potential. In this case, the first voltage V1 is a voltage from the first reference potential, and the second voltage V2 is a voltage from the second reference potential. The first voltage V1 is, for example, greater than or equal to 4.5 V and less than or equal to 5.5 V. The second voltage V2 is, for example, greater than or equal to 9 V and less than or equal to 24 V.

The transformers 40 will now be described in detail.

The gate driver 10 of the present embodiment includes two transformers 40 corresponding to two types of signals transmitted from the low-voltage circuit 20 to the high-voltage circuit 30. More specifically, the gate driver 10 includes a transformer 40 that is used to transmit a set signal and a transformer 40 that is used to transmit a reset signal. Hereinafter, for the sake of brevity, the transformer 40 used to transmit a set signal is referred to as a "transformer 40A." The transformer 40 used to transmit a reset signal is referred to as a "transformer 40B."

The gate driver 10 includes a low-voltage signal line 21A, which connects the low-voltage circuit 20 and the transformer 40A, and a low-voltage signal line 21B, which connects the low-voltage circuit 20 and the transformer 40B. Thus, the low-voltage signal line 21A transmits the set signal from the low-voltage circuit 20 to the transformer 40A. The low-voltage signal line 21B transmits the reset signal from the low-voltage circuit 20 to the transformer 40B.

The gate driver 10 includes a high-voltage signal line 31A, which connects the transformer 40A and the high-voltage circuit 30, and a high-voltage signal line 31B, which connects the transformer 40B and the high-voltage circuit 30. Thus, the high-voltage signal line 31A transmits the set signal from the transformer 40A to the high-voltage circuit 30. The high-voltage signal line 31B transmits the reset signal from the transformer 40B to the high-voltage circuit 30.

The transformer 40A electrically insulates the low-voltage circuit 20 from the high-voltage circuit 30 while transmitting the set signal from the low-voltage circuit 20 to the high-voltage circuit 30. That is, the insulation voltage of the transformer 40A is, for example, greater than or equal to 2500 Vrms and less than or equal to 7500 Vrms. Further, the insulation voltage of the transformer 40A may be, for example, greater than or equal to 2500 Vrms and less than or equal to 5700 Vrms.

The transformer 40A includes a first coil 41A and a second coil 42A that is electrically insulated from and configured to be magnetically coupled to the first coil 41A.

The first coil 41A is connected to the low-voltage circuit 20 by the low-voltage signal line 21A and is also connected to the ground of the low-voltage circuit 20. More specifically, the first coil 41A includes a first end electrically connected to the low-voltage circuit 20 and a second end electrically connected to the ground of the low-voltage circuit 20. Thus, the potential of the second end of the first coil 41A equals the first reference potential. The first reference potential is, for example, 0 V.

The second coil 42A is connected to the high-voltage circuit 30 by the high-voltage signal line 31A and is also connected to the ground of the high-voltage circuit 30. More specifically, the second coil 42A includes a first end electrically connected to the high-voltage circuit 30 and a second end electrically connected to the ground of the high-voltage circuit 30. Thus, the potential of the second end of the second coil 42A equals the second reference potential. The ground of the high-voltage circuit 30 is connected to the source of the switching element 501. Thus, the second reference potential fluctuates as the inverter device 500 is driven and may become, for example, greater than or equal to 600 V.

The transformer 40B electrically insulates the low-voltage circuit 20 from the high-voltage circuit 30 while transmitting the reset signal from the low-voltage circuit 20 to the high-voltage circuit 30. The insulation voltage of the transformer 40B is equal to the insulation voltage of the transformer 40A. The transformer 40B includes a first coil 41B and a second coil 42B that is electrically insulated from and configure to be magnetically coupled to the first coil 41B. The connection configuration of the transformer 40B is the same as the connection configuration of the transformer 40A and thus will not be described in detail. In the present embodiment, the first coils 41A and 41B correspond to a "first conductor." The second coils 42A and 42B correspond to a "second conductor."

Figure 2:
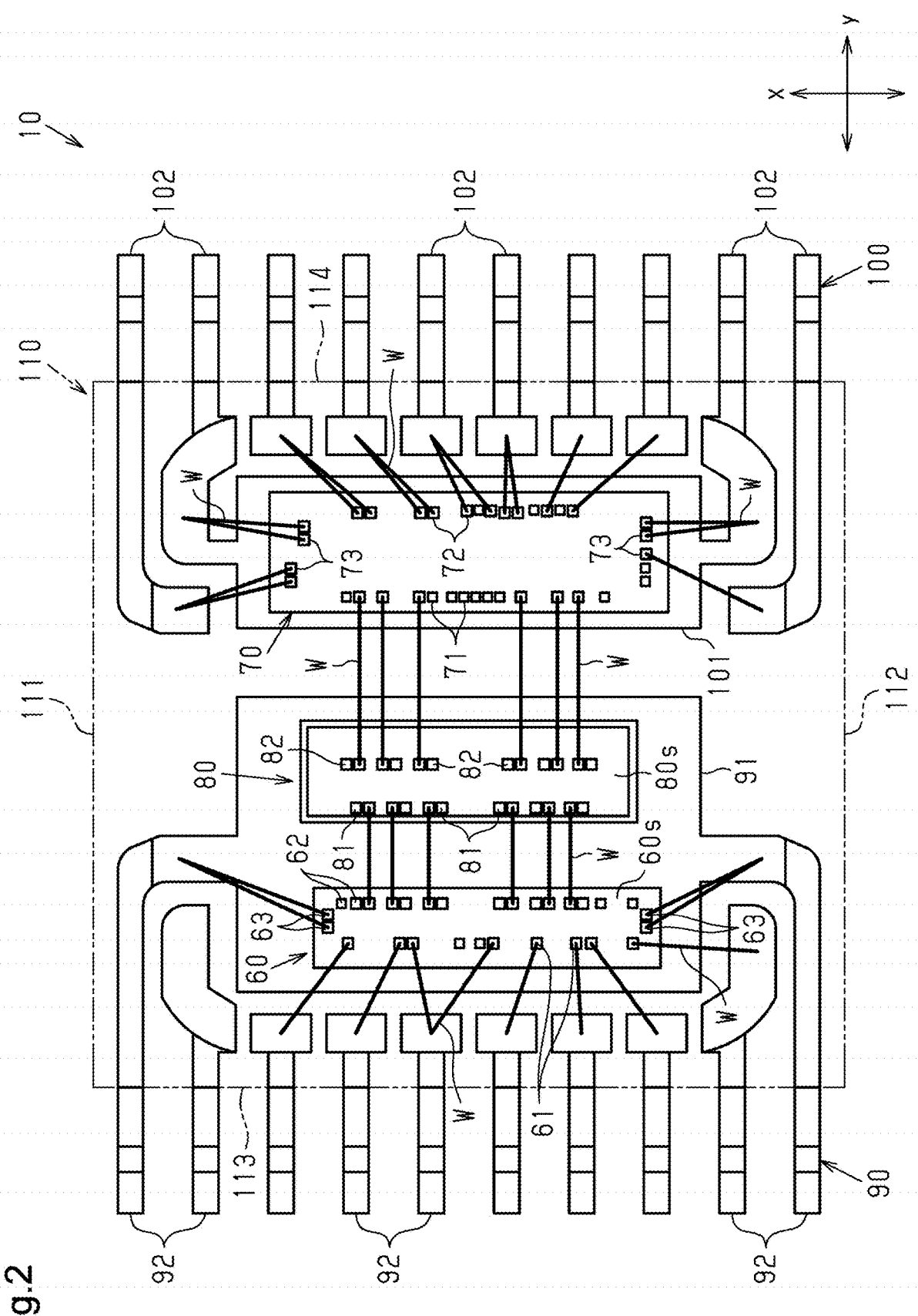
FIG. 2 is a plan view showing an internal structure of the gate driver of the first embodiment.

FIG. 2 shows an example of a plan view showing the internal structure of the gate driver 10. FIG. 1 shows a simplified circuit configuration of the gate driver 10. Hence, the number of external terminals of the gate driver 10 shown in FIG. 2 is greater than the number of external terminals of the gate driver 10 shown in FIG. 1. The number of external terminals of the gate driver 10 is the number of external electrodes configured to connect the gate driver 10 to electronic components arranged outside the gate driver 10, such as the ECU 503 and the switching element 501 (refer to FIG. 1). The number of signal lines (the number of wires W described later) that transmit a signal from the low-voltage circuit 20 to the high-voltage circuit 30 in the gate driver 10 shown in FIG. 2 is greater than the number of signal lines in the gate driver 10 shown in FIG. 1.

As shown in FIG. 2, the gate driver 10 is a semiconductor device including multiple semiconductor chips arranged in a single package and is, for example, mounted on a circuit substrate disposed in the inverter device 500. Each of the switching elements 501 and 502 is mounted on a mount substrate that differs from the circuit substrate. A cooling unit is attached to the mount substrate.

The package type of the gate driver 10 is small outline (SO) and, in the present embodiment, is a small outline package (SOP). The gate driver 10 includes a low-voltage circuit chip 60, a high-voltage circuit chip 70, and a transformer chip 80, which are semiconductor chips, a low-voltage lead frame 90 on which the low-voltage circuit chip 60 is mounted, a high-voltage lead frame 100 on which the high-voltage circuit chip 70 is mounted, and a mold resin 110 that encapsulates the chips 60, 70, 80 and a part of the lead frames 90 and 100. In the present embodiment, the transformer chip 80 and the mold resin 110 correspond to an "insulation module" that insulates the low-voltage circuit 20 from the high-voltage circuit 30. In FIG. 2, the mold resin 110 is indicated by double-dashed lines to illustrate the internal structure of the gate driver 10. The package type of the gate driver 10 may be changed in any manner.

The mold resin 110 is formed from an electrically insulating material and is formed from, for example, a black epoxy resin. The mold resin 110 has the form of a rectangular plate having a thickness-wise direction conforming to the z-direction. The mold resin 110 includes four resin side surfaces 111 to 114. More specifically, the mold resin 110 includes two end surfaces in the x-direction, namely, the resin side surfaces 111 and 112, and two end surfaces in the y-direction, namely, the resin side surfaces 113 and 114. The x-direction and the y-direction are orthogonal to the z-direction. The x-direction and the y-direction are orthogonal to each other. In the description hereafter, a plan view means a view in the z-direction.

The low-voltage lead frame 90 and the high-voltage lead frame 100 are formed from a conductor and, in the present embodiment, are formed from copper (Cu). The lead frames 90 and 100 extend from the inside to the outside of the mold resin 110.

The low-voltage lead frame 90 includes a low-voltage die pad 91 disposed in the mold resin 110 and low-voltage leads 92 extending from the inside to the outside of the mold resin 110. Each low-voltage lead 92 includes an external terminal configured to be electrically connected to an external electronic device such as the ECU 503 (refer to FIG. 1).

In the present embodiment, the low-voltage circuit chip 60 and the transformer chip 80 are mounted on the low-voltage die pad 91. In plan view, the low-voltage die pad 91 is disposed so that the center of the low-voltage die pad 91 in the y-direction is located closer in the y-direction to the resin side surface 113 than the center of the mold resin 110 is. In the present embodiment, the low-voltage die pad 91 is not exposed from the mold resin 110. In plan view, the low-voltage die pad 91 is rectangular so that the long sides extend in the x-direction and the short sides extend in the y-direction.

The low-voltage leads 92 are spaced apart from each other in the x-direction. Among the low-voltage leads 92, the low-voltage leads 92 located at opposite ends in the x-direction are integrated with the low-voltage die pad 91. Each low-voltage lead 92 partially projects from the resin side surface 113 toward the outside of the mold resin 110.

The high-voltage lead frame 100 includes a high-voltage die pad 101 disposed in the mold resin 110 and high-voltage leads 102 extending from the inside to the outside of the mold resin 110. Each high-voltage lead 102 includes an external terminal configured to be electrically connected to an external electronic device such as the gate of the switching element 501 (refer to FIG. 1).

The high-voltage circuit chip 70 is mounted on the high-voltage die pad 101. In plan view, the high-voltage die pad 101 is disposed closer in the y-direction to the resin side surface 114 than the low-voltage die pad 91 is. In the present embodiment, the high-voltage die pad 101 is not exposed from the mold resin 110. In plan view, the high-voltage die pad 101 is rectangular so that the long sides extend in the x-direction and the short sides extend in the y-direction.

The low-voltage die pad 91 and the high-voltage die pad 101 are spaced apart from each other in the y-direction. The y-direction may also be referred to as the arrangement direction of the two die pads 91 and 101.

The dimension of the low-voltage die pad 91 and the high-voltage die pad 101 in the y-direction is set in accordance with the size and the number of semiconductor chips that are mounted. In the present embodiment, the low-voltage circuit chip 60 and the transformer chip 80 are mounted on the low-voltage die pad 91, and the high-voltage circuit chip 70 is mounted on the high-voltage die pad 101. Hence, the low-voltage die pad 91 is greater than the high-voltage die pad 101 in dimension in the y-direction.

The high-voltage leads 102 are spaced apart from each other in the x-direction. Among the high-voltage leads 102, two of the high-voltage leads 102 are integrated with the high-voltage die pad 101. Each high-voltage lead 102 partially projects from the resin side surface 114 toward the outside of the mold resin 110.

In the present embodiment, the number of the high-voltage leads 102 is the same as the number of the low-voltage leads 92. As shown in FIG. 2, the low-voltage leads 92 and the high-voltage leads 102 are arranged in a direction (x-direction) orthogonal to the arrangement direction (y-direction) of the low-voltage die pad 91 and the high-voltage die pad 101. The number of the high-voltage leads 102 and the number of the low-voltage leads 92 may be changed in any manner.

In the present embodiment, the low-voltage die pad 91 is supported by two low-voltage leads 92 integrated with the low-voltage die pad 91, and the high-voltage die pad 101 is supported by two high-voltage leads 102 integrated with the high-voltage die pad 101. Thus, the die pads 91 and 101 do not include suspension leads exposed from the resin side surfaces 111 and 112. This increases the insulation distance between the low-voltage lead frame 90 and the high-voltage lead frame 100.

The low-voltage circuit chip 60, the high-voltage circuit chip 70, and the transformer chip 80 are spaced apart from each other in the y-direction. The low-voltage circuit chip 60, the transformer chip 80, and the high-voltage circuit chip 70 are arranged in this order in the y-direction from the low-voltage leads 92 toward the high-voltage leads 102.

The low-voltage circuit chip 60 includes the low-voltage circuit 20 shown in FIG. 1. In plan view, the low-voltage circuit chip 60 is rectangular and has short sides and long sides. In plan view, the low-voltage circuit chip 60 is mounted on the low-voltage die pad 91 such that the long sides extend in the x-direction and the short sides extend in the y-direction. The low-voltage circuit chip 60 includes a chip main surface 60s and a chip back surface (not shown) facing opposite directions in the z-direction. The chip back surface of the low-voltage circuit chip 60 is bonded to the low-voltage die pad 91 by a conductive bonding material such as solder or silver (Ag) paste.

First electrode pads 61, second electrode pads 62, and third electrode pads 63 are formed on the chip main surface 60s of the low-voltage circuit chip 60. The electrode pads 61 to 63 are electrically connected to the low-voltage circuit 20.

The first electrode pads 61 are located on the chip main surface 60s between the center of the chip main surface 60s in the y-direction and the low-voltage leads 92. The first electrode pads 61 are arranged in the x-direction. The second electrode pads 62 are disposed on one of the opposite ends of the chip main surface 60s in the y-direction located closer to the transformer chip 80. The second electrode pads 62 are arranged in the x-direction. The third electrode pads 63 are disposed on opposite ends of the chip main surface 60s in the x-direction.

The high-voltage circuit chip 70 includes the high-voltage circuit 30 shown in FIG. 1. In plan view, the high-voltage circuit chip 70 is rectangular and has short sides and long sides. In plan view, the high-voltage circuit chip 70 is mounted on the high-voltage die pad 101 such that the long sides extend in the x-direction and the short sides extend in the y-direction. The high-voltage circuit chip 70 includes a chip main surface 70s and a chip back surface (not shown) facing opposite directions in the z-direction. The chip back surface of the high-voltage circuit chip 70 is bonded to the high-voltage die pad 101 by a conductive bonding material.

First electrode pads 71, second electrode pads 72, and third electrode pads 73 are formed on the chip main surface 70s of the high-voltage circuit chip 70. The electrode pads 71 to 73 are electrically connected to the high-voltage circuit 30.

The first electrode pads 71 are disposed on one of the opposite ends of the chip main surface 70s in the y-direction located closer to the transformer chip 80. The first electrode pads 71 are arranged in the x-direction. The second electrode pads 72 are disposed on one of the opposite ends of the chip main surface 70s in the y-direction located farther from the transformer chip 80. In other words, the second electrode pads 72 are disposed on one of the opposite ends of the chip main surface 70s in the y-direction located closer to the high-voltage leads 102. The second electrode pads 72 are arranged in the x-direction. The third electrode pads 73 are disposed on opposite ends of the chip main surface 70s in the x-direction.

The transformer chip 80 includes the transformer 40 shown in FIG. 1. In plan view, the transformer chip 80 is rectangular and has short sides and long sides. In the present embodiment, in plan view, the transformer chip 80 is mounted on the low-voltage die pad 91 such that the long sides extend in the x-direction and the short sides extend in the y-direction.

The transformer chip 80 is disposed adjacent to the low-voltage circuit chip 60 in the y-direction. The transformer chip 80 is disposed closer to the high-voltage circuit chip 70 than the low-voltage circuit chip 60. That is, the transformer chip 80 is disposed between the low-voltage circuit chip 60 and the high-voltage circuit chip 70 in the y-direction.

The transformer chip 80 includes a chip main surface 80s and a chip back surface 80r (refer to FIG. 7) facing in opposite directions in the z-direction. The chip back surface 80r of the transformer chip 80 is bonded to the low-voltage die pad 91 by the conductive bonding material SD (refer to FIG. 7).

As shown in FIG. 2, first electrode pads 81 and second electrode pads 82 are formed on the chip main surface 80s of the transformer chip 80. In the present embodiment, each first electrode pad 81 corresponds to a "first electrode." Each second electrode pad 82 corresponds to a "second electrode."

Figure 4:
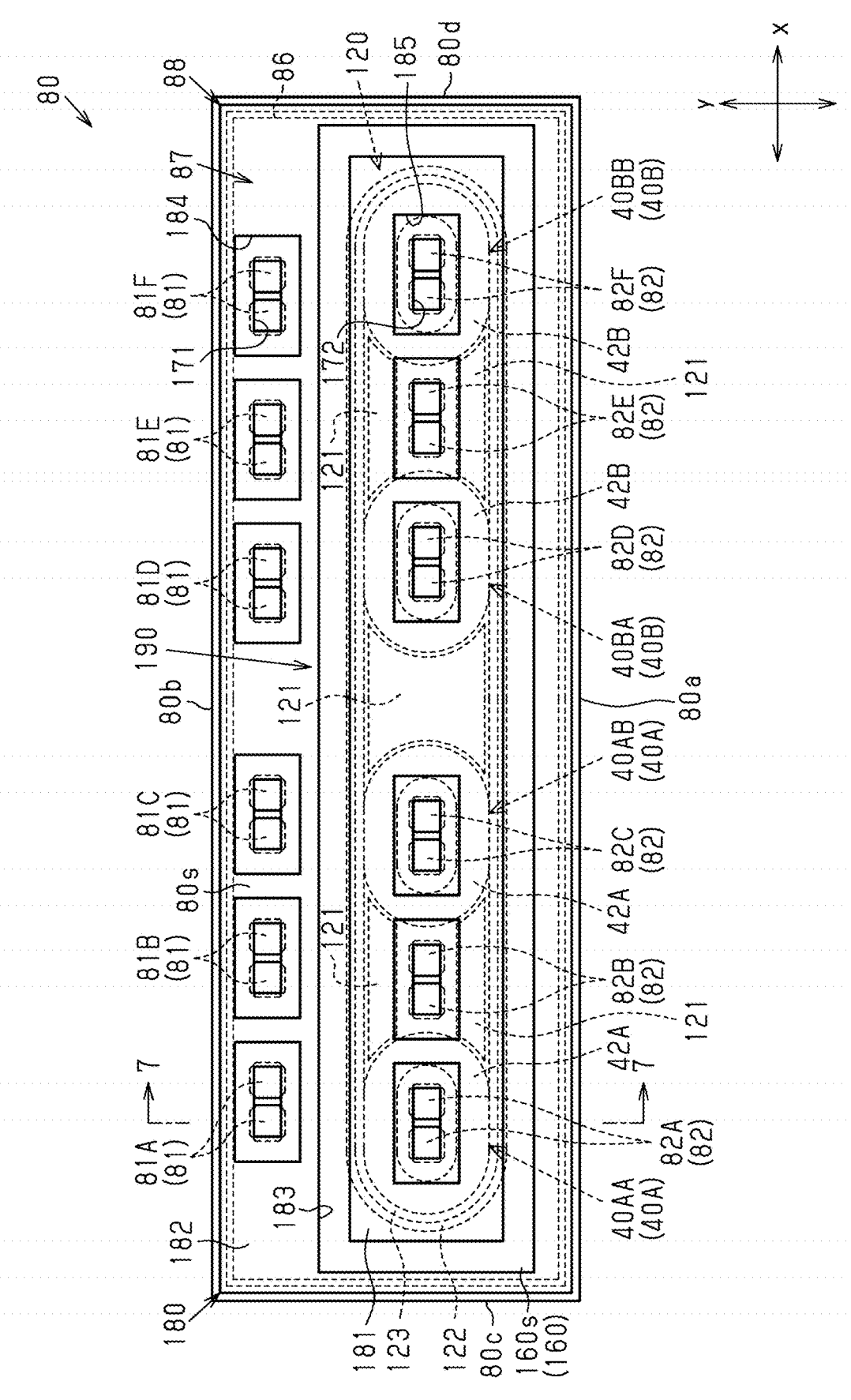
FIG. 4 is a plan view of the transformer chip shown in FIG. 3.

The first electrode pads 81 are disposed, for example, on one of the opposite ends of the chip main surface 80s in the y-direction located closer to the low-voltage circuit chip 60. The first electrode pads 81 are arranged in the x-direction. The second electrode pads 82 are, for example, disposed near the center of the chip main surface 80s in the y-direction. The second electrode pads 82 are arranged in the x-direction. In plan view, the transformers 40A and 40B are disposed near the center of the chip main surface 80s in the y-direction. As shown in FIG. 4, in plan view, the second electrode pads 82 are arranged so as not to overlap with the transformers 40A and 40B. Each of the electrode pads 81 and 82 are electrically connected to the transformers 40A and 40B.

As shown in FIG. 2, the lead frames 90 and 100 are located closest to each other at the low-voltage die pad 91 and the high-voltage die pad 101. Therefore, the low-voltage die pad 91 and the high-voltage die pad 101 need to be separated from each other so that the insulation voltage of the gate driver 10 is set to a predetermined insulation voltage. Hence, in plan view, the distance between the high-voltage circuit chip 70 and the transformer chip 80 is greater than the distance between the low-voltage circuit chip 60 and the transformer chip 80.

Wires W are connected to each of the low-voltage circuit chip 60, the transformer chip 80, and the high-voltage circuit chip 70. Each of the wires W is a bonding wire formed by a wire bonder and is, for example, formed from a conductor such as gold (Au), aluminum (Al), or Cu.

The low-voltage circuit chip 60 is electrically connected to the low-voltage lead frame 90 by wires W. More specifically, the first electrode pads 61 and the third electrode pads 63 of the low-voltage circuit chip 60 are connected to the low-voltage leads 92 by wires W. The third electrode pads 63 of the low-voltage circuit chip 60 are connected by wires W to the two low-voltage leads 92 integrated with the low-voltage die pad 91. Thus, the low-voltage circuit 20 is electrically connected to the low-voltage leads 92 (external electrodes of the gate driver 10 that are electrically connected to the ECU 503). In the present embodiment, the two low-voltage leads 92 integrated with the low-voltage die pad 91 include a ground terminal, and the wires W electrically connect the low-voltage circuit 20 to the low-voltage die pad 91. Thus, the low-voltage die pad 91 has the same potential as the ground of the low-voltage circuit 20.

The high-voltage circuit chip 70 and the high-voltage leads 102 of the high-voltage lead frame 100 are electrically connected by wires W. More specifically, the second electrode pads 72 and the third electrode pads 73 of the high-voltage circuit chip 70 are connected to the high-voltage leads 102 by the wires W. Thus, the high-voltage circuit 30 is electrically connected to the high-voltage leads 102 (external electrodes of the gate driver 10 that are electrically connected to the switching element 501 or the like). In the present embodiment, the two high-voltage leads 102 integrated with the high-voltage die pad 101 include a ground terminal, and the wires W electrically connect the high-voltage circuit 30 and the high-voltage die pad 101. Thus, the high-voltage die pad 101 has the same potential as the ground of the high-voltage circuit 30.

The transformer chip 80 is connected to the low-voltage circuit chip 60 and the high-voltage circuit chip 70 by wires W. More specifically, the first electrode pads 81 of the transformer chip 80 and the second electrode pads 62 of the low-voltage circuit chip 60 are connected by wires W. More specifically, the second electrode pads 82 of the transformer chip 80 and the first electrode pads 71 of the high-voltage circuit chip 70 are connected by wires W.

Each of the first coil 41A of the transformer 40A and the first coil 41B of the transformer 40B (refer to FIG. 1) is electrically connected to the ground of the low-voltage circuit 20 through the wires W, the low-voltage circuit chip 60, and the like. Each of the second coil 42A of the transformer 40A and the second coil 42B of the transformer 40B (refer to FIG. 1) is electrically connected to the ground of the high-voltage circuit 30 through the wires W, the high-voltage circuit chip 70, and the like.

An example of the structure of the transformer chip 80 will now be described with reference to FIGS. 3 to 9. The structure of the transformer 40B is the same as that of the transformer 40A and thus will not be described in detail. In the following description, a direction from the chip back surface 80r of the transformer chip 80 toward the chip main surface 80s is referred to as an upward direction, and a direction from the chip main surface 80s toward the chip back surface 80r is referred to as a downward direction.

FIG. 4 is a plan view of the transformer chip 80. For the sake of illustration, the transformers 40A and 40B and a shield electrode 86 and a dummy pattern 120, which will be described later, are indicated by broken lines.

Figure 5:
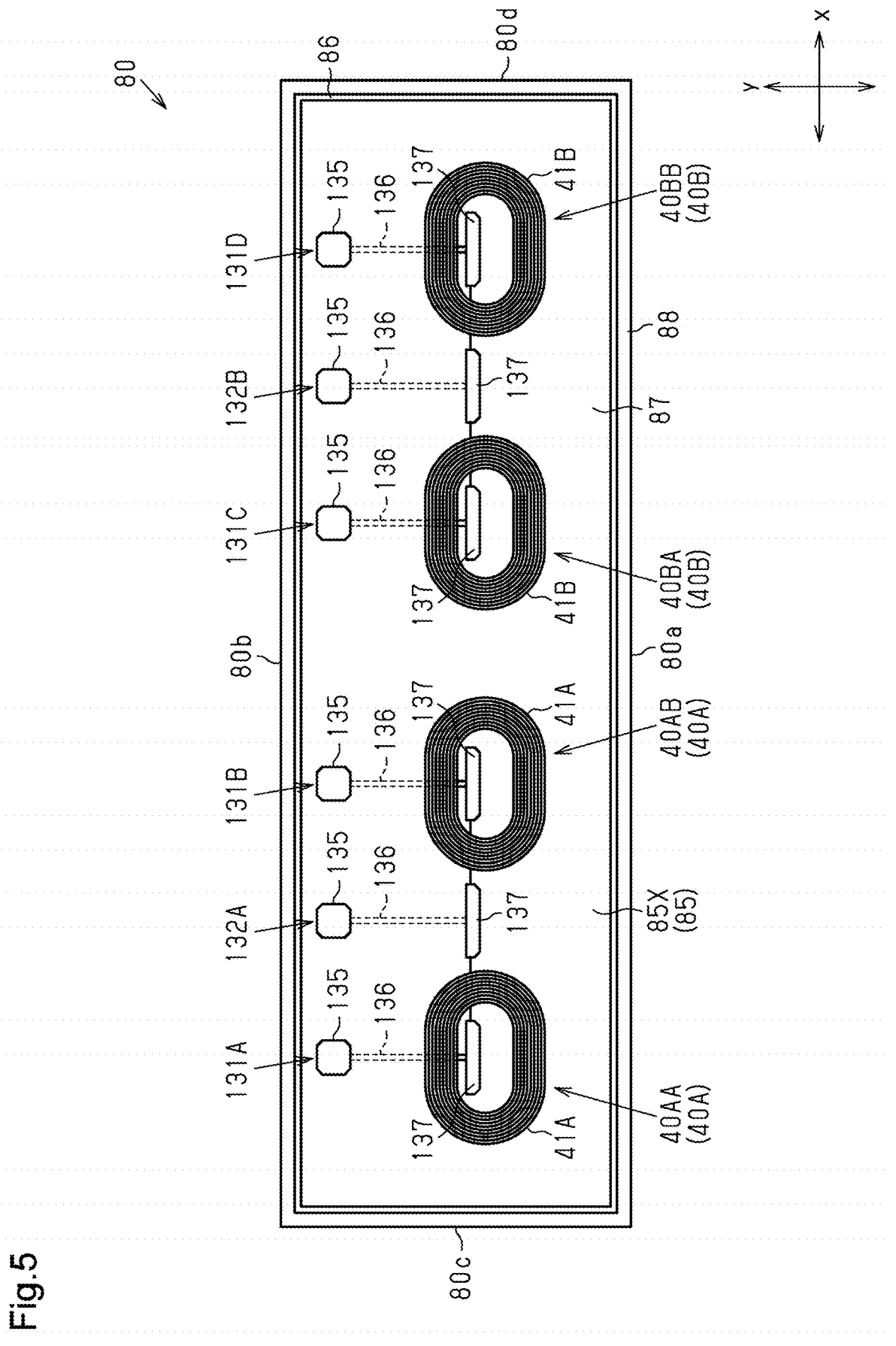
FIG. 5 is a cross-sectional view schematically showing the internal structure of the transformer chip shown in FIG. 3.
Figure 6:
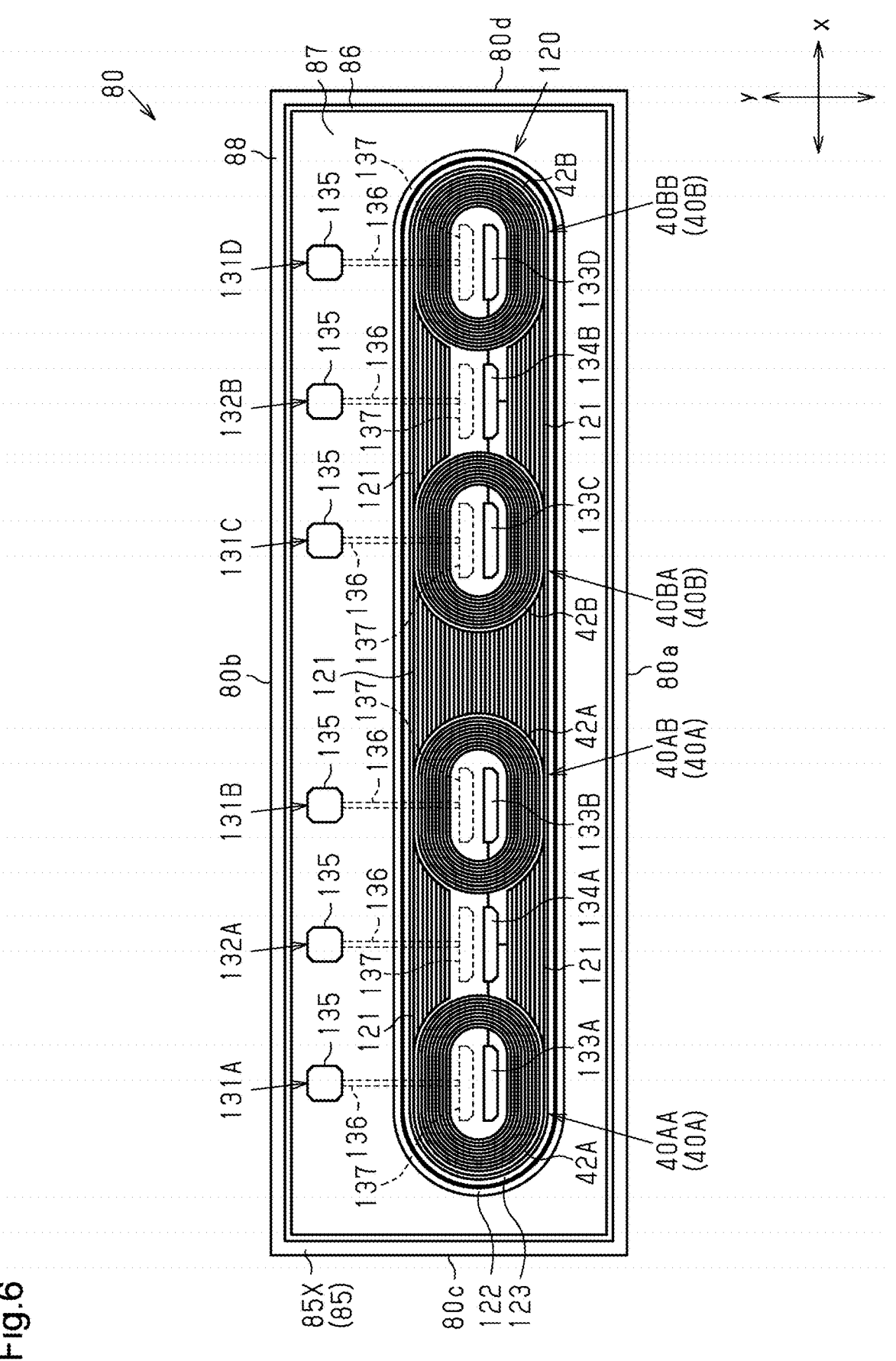
FIG. 6 is a cross-sectional view schematically showing the internal structure of the transformer chip shown in FIG. 3 at a position differing from that of FIG. 5.

FIG. 5 is a cross-sectional view of the transformer chip 80 that is cut along an xy-plane through a position of the first coils 41A and 41B of the transformers 40AA, 40AB, 40BA, and 40BB in the z-direction showing the connection relationship of the first coils 41A and 41B of the transformers 40AA, 40AB, 40BA, and 40BB. FIG. 6 is a cross-sectional view of the transformer chip 80 that is cut along an xy-plane through a position of the second coils 42A and 42B of the transformers 40AA, 40AB, 40BA, and 40BB in the z-direction showing the connection relationship of the second coils 42A and 42B of the transformers 40AA, 40AB, 40BA, and 40BB. FIGS. 5 and 6 do not show hatching for the sake of convenience.

Figure 7:
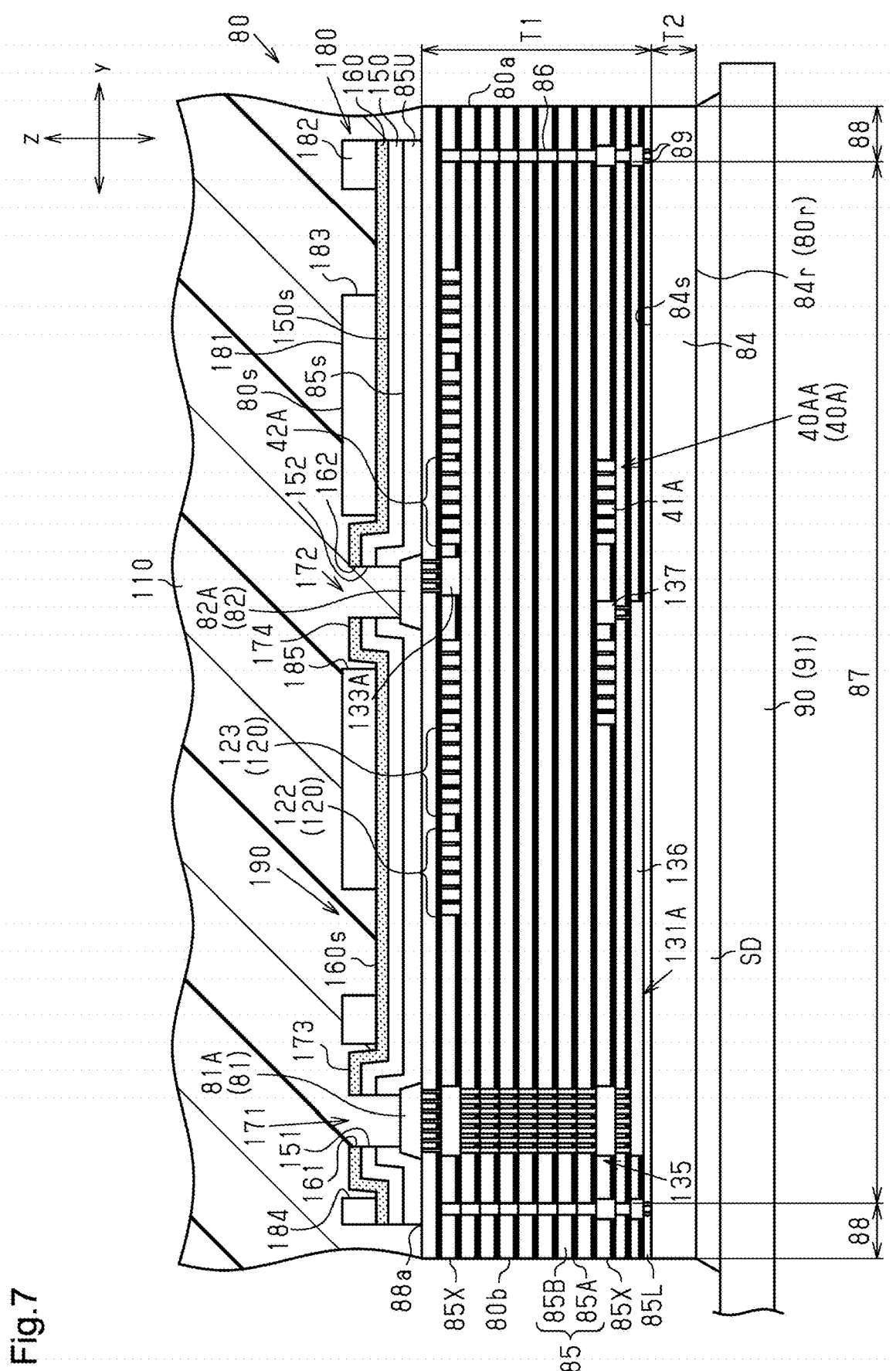
FIG. 7 is a cross-sectional view of the transformer chip mounted on a low-voltage die pad taken along line 7-7 in FIG. 4.
Figure 8:
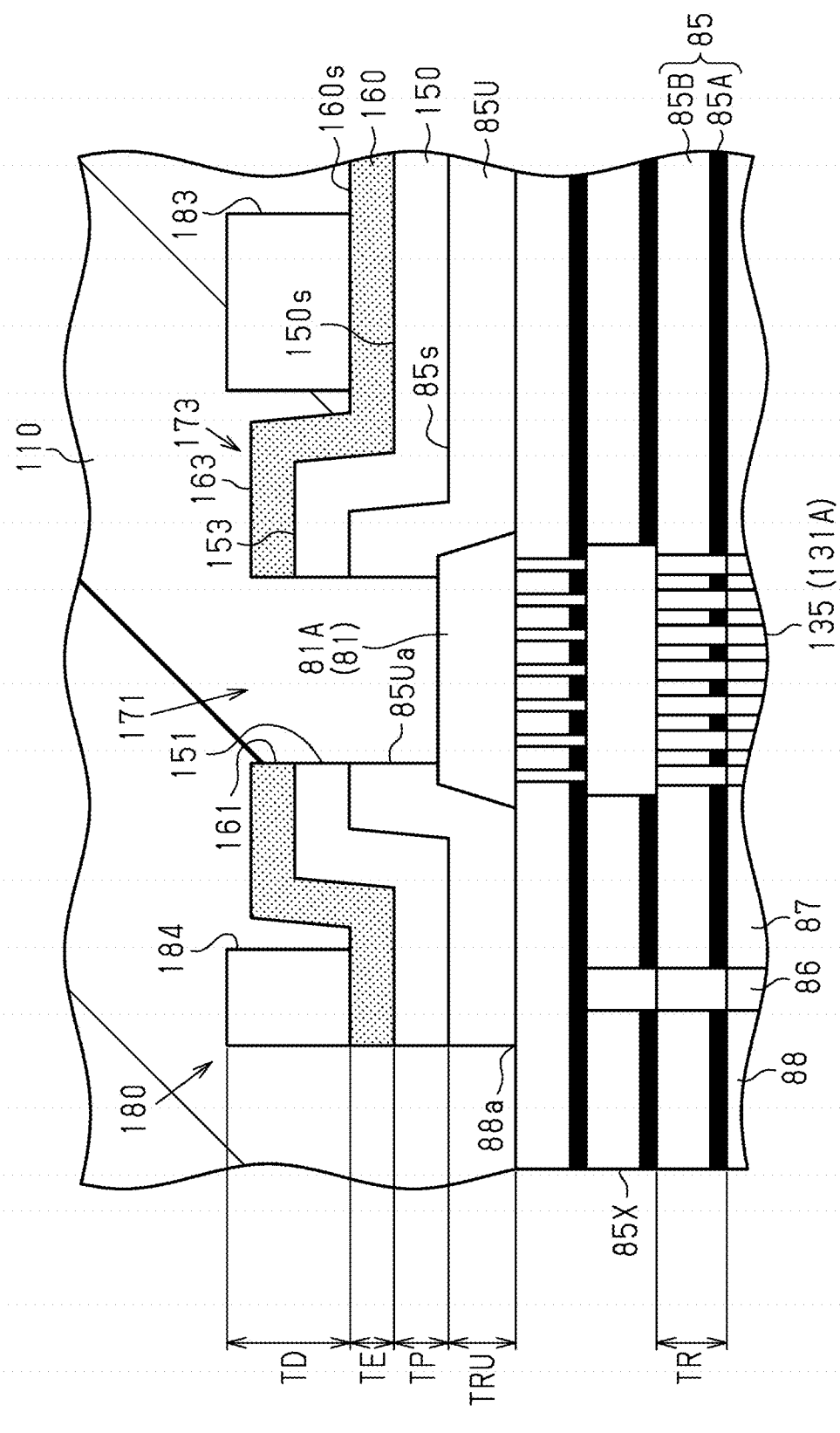
FIG. 8 is an enlarged view showing a portion of the transformer chip shown in FIG. 7.
Figure 9:
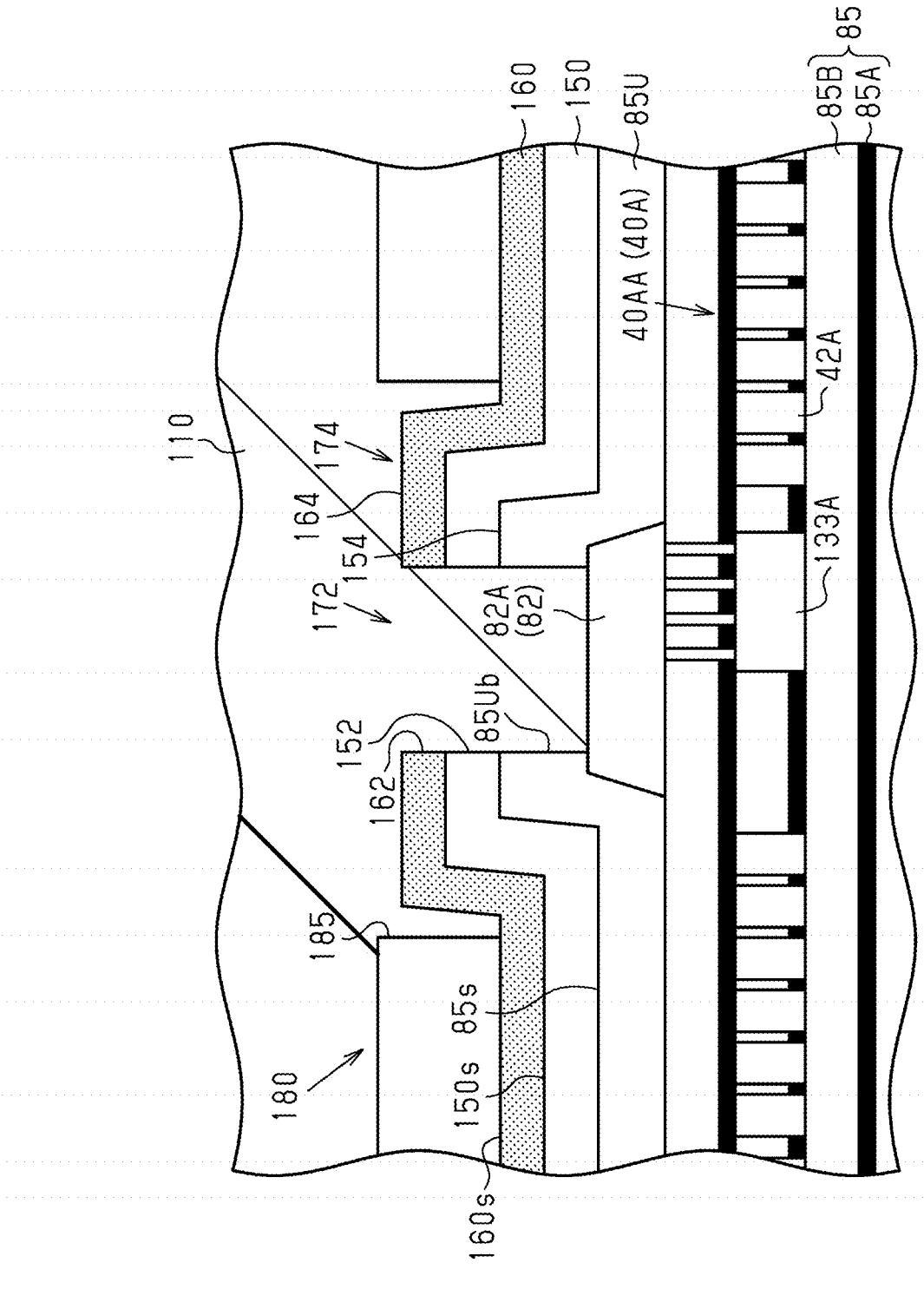
FIG. 9 is an enlarged view showing a portion of the transformer chip shown in FIG. 7 that differs from the portion shown in FIG. 8.

FIG. 7 is a cross-sectional view of the transformer 40A of the transformer chip 80 and its surroundings taken along line 7-7 in FIG. 4. FIG. 7 shows the transformer chip 80 that is encapsulated by the mold resin 110 of the gate driver 10 for the sake of convenience. FIG. 7 partially does not show hatching for simplicity and clarity. FIGS. 8 and 9 are each an enlarged view showing a portion of FIG. 7 and partially do not show hatching in the same manner as FIG. 7.

As shown in FIG. 4, the transformer chip 80 includes the transformers 40A and 40B. More specifically, the transformers 40A and 40B are integrated into a single chip. More specifically, the transformer chip 80 is a semiconductor chip that is separate from the low-voltage circuit chip 60 and the high-voltage circuit chip 70 (refer to FIG. 2) and is dedicated to the transformers 40A and 40B. The transformer chip 80 includes four chip side surfaces 80a, 80b, 80c, and 80d that are orthogonal to the chip main surface 80s and the chip back surface 80r. The chip side surfaces 80a to 80d are arranged between the chip main surface 80s and the chip back surface 80r in the z-direction. The chip side surfaces 80a and 80b define opposite surfaces of the transformer chip 80 in the y-direction. The chip side surfaces 80c and 80d define opposite surfaces of the transformer chip 80 in the x-direction. In plan view, the chip side surfaces 80a and 80b define long sides of the transformer chip 80. The chip side surfaces 80c and 80d define short sides of the transformer chip 80. In the present embodiment, the chip side surface 80a is located closer to the high-voltage circuit chip 70 (refer to FIG. 2) than the chip side surface 80b. The chip side surface 80b is located closer to the low-voltage circuit chip 60 (refer to FIG. 2) than the chip side surface 80a. As shown in FIG. 7, the transformer chip 80 includes a substrate 84 and an insulation layer 85 disposed on the substrate 84.

The substrate 84 is formed of, for example, a semiconductor substrate. In the present embodiment, the substrate 84 is formed from a material containing silicon (Si). As the semiconductor substrate, a wide-bandgap semiconductor or a compound semiconductor may be used for the substrate 84. Alternatively, instead of the semiconductor substrate, an insulating substrate formed from a glass-containing material may be used for the substrate 84.

The wide-bandgap semiconductor is a semiconductor substrate having a band gap that is greater than or equal to 2.0 eV. The wide-bandgap semiconductor may be silicon carbide (SiC). The compound semiconductor may be a group III-V compound semiconductor. The compound semiconductor may include at least one of aluminum nitride (AlN), indium nitride (InN), gallium nitride (GaN), and gallium arsenide (GaAs).

The substrate 84 includes a substrate main surface 84s and a substrate back surface 84r facing opposite directions in the z-direction. The substrate back surface 84r defines the chip back surface 80r of the transformer chip 80.

In the present embodiment, insulation layers 85 are stacked on the substrate main surface 84s of the substrate 84 in the z-direction. Thus, the z-direction may be referred to as a thickness-wise direction of the insulation layers 85. The insulation layers 85 are formed on the substrate main surface 84s of the substrate 84. In the present embodiment, a total thickness T1 of the insulation layers 85 is greater than a thickness T2 of the substrate 84 (T1>T2). The number of the insulation layers 85 stacked is set in accordance with an insulation voltage required of the transformer chip 80. Therefore, depending on the number of the insulation layers 85 stacked, the thickness T1 may be less than the thickness T2 (T1<T2).

The insulation layers 85 include a first insulation layer 85A and a second insulation layer 85B disposed on the first insulation layer 85A.

The first insulation layer 85A is, for example, an etching stopper layer, and is formed from silicon nitride (SiN), SiC, nitrogen-added silicon carbide (SiCN), or the like. In the present embodiment, the first insulation layer 85A is formed from SiN. The second insulation layer 85B is, for example, an interlayer insulation layer and is formed from silicon oxide ($SiO_2$). As shown in FIG. 7, the second insulation layer 85B is greater in thickness than the first insulation layer 85A. The first insulation layer 85A may be greater than or equal to 100 nm and less than 1000 nm. The second insulation layer 85B may be greater than or equal to 1000 nm and less than or equal to 3000 nm. In the present embodiment, the thickness of the first insulation layer 85A is, for example, approximately 300 nm, and the thickness of the second insulation layer 85B is, for example, approximately 2000 nm.

The second insulation layer 85B includes a lowermost insulation layer 85L, which is in contact with the substrate main surface 84s of the substrate 84, and an uppermost insulation layer 85U. Thus, each of the lowermost insulation layer 85L and the uppermost insulation layer 85U is smaller in thickness than other insulation layers 85. The thickness of each of the lowermost insulation layer 85L and the uppermost insulation layer 85U is greater than or equal to the thickness of the first insulation layer 85A and less than or equal to the thickness of the second insulation layer 85B.

The thickness of the lowermost insulation layer 85L and the uppermost insulation layer 85U may be changed in any manner. In an example, the thickness of each of the lowermost insulation layer 85L and the uppermost insulation layer 85U may be greater than that of the second insulation layer 85B or may be greater than or equal to that of the insulation layer 85 including the first insulation layer 85A and the second insulation layer 85B.

The uppermost insulation layer 85U includes outer side surfaces located inward from outer side surfaces of other insulation layers 85. In an example, as shown in FIG. 7, the outer side surface of the uppermost insulation layer 85U facing the same direction as the chip side surface 80a is located inward from the chip side surface 80a in the y-direction. The outer side surface of the uppermost insulation layer 85U facing the same direction as the chip side surface 80b is located inward from the chip side surface 80b in the y-direction.

The transformer chip 80 includes the shield electrode 86 arranged in the insulation layers 85. The shield electrode 86 limits entrance of moisture into the insulation layers 85 and formation of cracks in the insulation layers 85. In plan view, the shield electrode 86 is arranged on a peripheral portion of the insulation layers 85 (peripheral portion of the transformer chip 80). More specifically, as shown in FIGS. 4 to 6, the shield electrode 86 is spaced apart from the chip side surfaces 80a to 80d. In plan view, the shield electrode 86 is strip-shaped and extends along the chip side surfaces 80a to 80d. In the present embodiment, the shield electrode 86 has the form of a rectangular loop in plan view. The shield electrode 86 divides the insulation layers 85 into an inner region 87 and an outer region 88. In the present embodiment, as shown in FIG. 7, the uppermost insulation layer 85U extends across the shield electrode 86 in plan view. That is, the uppermost insulation layer 85U includes the outer region 88.

As shown in FIG. 4, the inner region 87 is a region of the insulation layers 85 protected by the shield electrode 86. In plan view, the inner region 87 is rectangular so that the long sides extend in the x-direction and the short sides extend in the y-direction. The outer region 88 is a rectangular loop region surrounding the inner region 87 in plan view. The outer region 88 is located between the shield electrode 86 and each of the chip side surfaces 80a to 80d in plan view.

Thus, the outer region 88 is a rectangular loop region including the chip side surfaces 80a to 80d.

The shield electrode 86 is formed from one or more materials selected from titanium (Ti), titanium nitride (TiN), Au, Ag, Cu, Al, and tungsten (W). As shown in FIG. 7, the shield electrode 86 extends through the insulation layers 85 in the z-direction. More specifically, as viewed in a direction orthogonal to the z-direction, the shield electrode 86 is arranged to overlap the coils 41A, 41B, 42A, 42B of the transformers 40A and 40B. In the present embodiment, the shield electrode 86 extends in the z-direction from the insulation layer 85 that is located below the uppermost insulation layer 85U, with one insulation layer interposed, to the insulation layer 85 that is located directly above the lowermost insulation layer 85L. The lowermost insulation layer 85L includes a via 89 extending through the lowermost insulation layer 85L in the z-direction. The via 89 is disposed to overlap the shield electrode 86 in plan view and connects the shield electrode 86 to the substrate 84. Thus, the shield electrode 86 is electrically connected to the substrate 84. In an example, the via 89 and the shield electrode 86 may be formed from the same material.

The transformer 40A and the transformer 40B are embedded in the insulation layers 85. The transformer 40A and the transformer 40B are disposed in the inner region 87. As shown in FIG. 4, the transformer 40A and the transformer 40B are aligned with each other in the y-direction and spaced apart from each other in the x-direction. In other words, in plan view, the transformer 40A and the transformer 40B are arranged in a direction orthogonal to a direction in which the chips 60, 70, 80 are arranged. The transformer chip 80 of the present embodiment includes two transformers 40A and two first transformers 40B. For the sake of brevity, the two transformers that are located close to the chip side surface 80c in the x-direction are referred to as a "transformer 40AA" and a "transformer 40AB," and the two transformers that are located close to the chip side surface 80d in the x-direction are referred to as a "transformer 40BA" and a "transformer 40BB."

As shown in FIG. 4, the transformer 40AA, the transformer 40AB, the transformer 40BA, and the transformer 40BB are arranged in this order in the x-direction from the chip side surface 80c toward the chip side surface 80d.

As shown in FIG. 7, the first coil 41A and the second coil 42A of the transformer 40AA are opposed to each other in the z-direction with the insulation layers 85 interposed. In the present embodiment, the first coil 41A and the second coil 42A are opposed to each other in the z-direction with the insulation layers 85 interposed.

Each of the coils 41A and 42A is formed as a conductive layer embedded in one of the insulation layers 85. More specifically, insulation layers 85X in which the coils 41A and 42A are respectively embedded include grooves extending through the first insulation layer 85A and the second insulation layer 85B in the z-direction. The conductive layers forming the coils 41A and 42A are embedded in the grooves of the insulation layers 85X. Each of the insulation layers 85X in which the coils 41A and 42A are embedded is covered by the insulation layers 85 that are adjacent to the insulation layer 85X in the z-direction. Thus, the coils 41A and 42A are embedded in the insulation layers 85.

In the z-direction, the second coil 42A is located farther away from the substrate 84 than the first coil 41A is. In other words, the second coil 42A is located above the first coil 41A. Also, in other words, the first coil 41A is located closer to the substrate 84 than the second coil 42A is. In the present embodiment, the distance between the first coil 41A and the second coil 42A in the z-direction is greater than the distance between the first coil 41A and the substrate main surface 84s of the substrate 84.

As shown in FIG. 4, the second coil 42A is elliptical and spiral in plan view. The first coil 41A is similar in shape to the second coil 42A. The first coil 41A and the second coil 42A are formed in the same winding direction in plan view. In the present embodiment, the first coil 41A and the second coil 42A are wound the same number of times. One or more from Ti, TiN, Au, Ag, Cu, Al, and W are selected for each of the coils 41A and 42A. The structure of the transformer 40AB is the same as that of the transformer 40AA and thus will not be described in detail.

As shown in FIG. 4, in plan view, the first electrode pads 81 and the second electrode pads 82 are arranged in the inner region 87. As shown in FIG. 7, the electrode pads 81 and 82 are formed on the insulation layer 85 that is located directly below the uppermost insulation layer 85U. The uppermost insulation layer 85U is aligned with the electrode pads 81 and 82. In other words, the electrode pads 81 and the electrode pads 82 are embedded in the insulation layers 85. As shown in FIG. 7, in the present embodiment, the electrode pad 81 and the electrode pad 82 are disposed farther away from the substrate 84 than the second coils 42A and 42B of the transformers 40A and 40B. In other words, the electrode pad 81 and the electrode pad 82 are disposed above the second coils 42A and 42B of the transformers 40A and 40B. In the present embodiment, the distance between the first coil 41A and the second coil 42A is greater than the distance between the second coil 42A and each of the electrode pads 81 and 82 in the z-direction.

The uppermost insulation layer 85U covers the peripheral portion of each of the electrode pads 81 and 82. More specifically, as shown in FIGS. 8 and 9, the uppermost insulation layer 85U includes a first insulation layer opening 85Ua exposing the first electrode pad 81 and a second insulation layer opening 85Ub exposing the second electrode pad 82. The first insulation layer opening 85Ua includes multiple first insulation layer openings 85Ua in accordance with multiple sets of two first electrode pads 81. The second insulation layer opening 85Ub includes multiple second insulation layer openings 85Ub in accordance with multiple sets of two second electrode pads 82.

As shown in FIG. 4, in plan view, each first electrode pad 81 is aligned with one of the two transformers 40AA and 40AB or one of the two transformers 40BA and 40BB in the x-direction or disposed between the transformer 40AA and the transformer 40AB in the x-direction or between the transformer 40BA and the transformer 40BB in the x-direction. The first electrode pads 81 are disposed closer to the chip side surface 80b in the y-direction than the transformers 40AA, 40AB, 40BA, and 40BB are. In other words, the first electrode pads 81 are disposed between the chip side surface 80b and the transformers 40AA, 40AB, 40BA, and 40BB in the y-direction. In other words, in plan view, the first electrode pads 81 are disposed closer to the low-voltage leads 92 (refer to FIG. 2) than the transformers 40AA, 40AB, 40BA, and 40BB are. For the sake of convenience, the first electrode pads 81 are referred to as first electrode pads 81A, first electrode pads 81B, first electrode pads 81C, first electrode pads 81D, first electrode pads 81E, and first electrode pads 81F from the chip side surface 80c toward chip side surface 80d. The first electrode pads 81A to 81F will be referred to as the first electrode pads 81 when the description is common to the first electrode pads 81A to 81F.

The first electrode pads 81A are disposed to overlap the transformer 40AA as viewed in the y-direction. The first electrode pads 81B are disposed to overlap a portion located between the transformer 40AA and the transformer 40AB in the x-direction as viewed in the y-direction. The first electrode pads 81C are disposed to overlap the transformer 40AB as viewed in the y-direction. The first electrode pads 81D are disposed to overlap the transformer 40BA as viewed in the y-direction. The first electrode pads 81E are disposed to overlap a portion located between the transformer 40BA and the transformer 40BB in the x-direction as viewed in the y-direction. The first electrode pads 81F are disposed to overlap the transformer 40BB as viewed in the y-direction. Each of the first electrode pads 81A to 81F are formed of two electrode pads located adjacent to each other in the x-direction. The first electrode pads 81A to 81F are aligned with each other in the y-direction and spaced apart from each other in the x-direction.

In plan view, the second electrode pads 82 are arranged in one of the transformers 40AA, 40AB, 40BA, and 40BB, a portion between the transformer 40AA and the transformer 40AB in the x-direction, or a portion between the transformer 40BA and the transformer 40BB in the x-direction. As viewed in the x-direction, the second electrode pads 82 are disposed to overlap the transformers 40AA, 40AB, 40BA, and 40BB. For the sake of convenience, the second electrode pads 82 are referred to as second electrode pads 82A, second electrode pads 82B, second electrode pads 82C, second electrode pads 82D, second electrode pads 82E, and second electrode pads 82F from the chip side surface 80c toward the chip side surface 80d. The second electrode pads 82A to 82F will be referred to as the second electrode pads 82 when the description is common to the second electrode pads 82A to 82F.

The second electrode pads 82A are disposed in an inner space of the transformer 40AA formed by the elliptical, spiral second coil 42A. The second electrode pads 82B are disposed between the transformer 40AA and the transformer 40AB in the x-direction. The second electrode pads 82C are disposed in an inner space of the transformer 40AB formed by the elliptical, spiral second coil 42A. The second electrode pads 82D are disposed in an inner space of the transformer 40BA formed by the elliptical, spiral second coil 42B. The second electrode pads 82E are disposed between the transformer 40BA and the transformer 40BB in the x-direction. The second electrode pads 82F are disposed in an inner space of the transformer 40BB formed by the elliptical, spiral second coil 42B. Each of the second electrode pads 82A to 82F are formed of two electrode pads adjacent to each other in the x-direction. The second electrode pads 82A to 82F are aligned with each other in the y-direction and spaced apart from each other in the x-direction.

As shown in FIGS. 4, 5, and 7, the first electrode pads 81A to 81F are separately electrically connected to the first coils 41A and 41B of the transformers 40AA, 40AB, 40BA, and 40BB. As shown in FIGS. 4, 6, and 7, the second electrode pads 82A to 82F are separately electrically connected the second coils 42A and 42B of the transformers 40AA, 40AB, 40BA, and 40BB.

As shown in FIGS. 5 and 6, the transformer chip 80 includes interconnects separately connecting the electrode pads 81A to 81F and 82A to 82F and the coils 41A, 41B, 42A, and 42B of the transformers 40AA, 40AB, 40BA, and 40BB. In the present embodiment, the interconnects include first interconnects 131A to 131F, second interconnects 132A and 132B, third interconnects 133A to 133D, and fourth interconnects 134A and 134B. The interconnects 131A to 131D, 132A, 132B, 133A to 133D, 134A, and 134B are disposed in the inner region 87 and formed from one or more selected from Ti, TiN, Au, Ag, Cu, Al, and W.

As shown in FIGS. 4 and 5, the first interconnect 131A connects the first electrode pads 81A and a first end of the first coil 41A of the transformer 40AA. The first interconnect 131B connects the first electrode pads 81C and a first end of the first coil 41A of the transformer 40AB. The first interconnect 131C connects the first electrode pads 81D and a first end of the first coil 41B of the transformer 40BA. The first interconnect 131D connects the first electrode pads 81F and a first end of the first coil 41B of the transformer 40BB.

The second interconnect 132A connects the first electrode pads 81B to a second end of the first coil 41A of the transformer 40AA and a second end of the first coil 41A of the transformer 40AB. The second interconnect 132B connects the first electrode pads 81E to a second end of the first coil 41B of the transformer 40BA and a second end of the first coil 41B of the transformer 40BB.

The first interconnects 131A to 131D have the same structure. The second interconnects 132A and 132B have the same structure. Thus, in the description hereafter, the structure of the first interconnect 131A and the structure of the second interconnect 132A will be described. The first interconnects 131B to 131D and the second interconnect 132B will not be described in detail.

As shown in FIG. 7, the first interconnect 131A includes a first interconnect part 135 extending through the insulation layers 85 in the z-direction, a second interconnect part 136 extending in the y-direction, and a third interconnect part 137 connected to the first end of the first coil 41A of the transformer 40AA.

The first interconnect part 135 is disposed to overlap the first electrode pads 81A in plan view and is connected to the first electrode pads 81A. The first interconnect part 135 extends through the insulation layers 85 from the insulation layer 85 that is located directly below the uppermost insulation layer 85U to the insulation layer 85 that is located above the lowermost insulation layer 85L with one insulation layer 85 interposed. The first interconnect part 135 includes a flat upper interconnect and a flat lower interconnect that are disposed at the same position as the insulation layers 85X including the coils 41A and 42A. The first interconnect part 135 further includes vias disposed between the upper and lower interconnects in the z-direction, between the upper interconnect and the first electrode pad 81A, and between the lower interconnect and the second interconnect part 136.

The second interconnect part 136 is disposed closer to the substrate 84 than the first interconnect part 135 is. The second interconnect part 136 is disposed closer to the substrate 84 than the first coil 41A is. In the present embodiment, among the insulation layers 85, the second interconnect part 136 is disposed in the insulation layer 85 located directly above the lowermost insulation layer 85L. Of opposite ends of the second interconnect part 136 in the x-direction, the one located closer to the chip side surface 80b of the transformer chip 80 overlaps the first interconnect part 135 in plan view. The second interconnect part 136 is connected to the first interconnect part 135. Of opposite ends of the second interconnect part 136 in the x-direction, the one located closer to the chip side surface 80a of the transformer chip 80 overlaps the first coil 41A of the transformer 40AA in plan view.

The third interconnect part 137 is disposed to overlap the second electrode pads 82A in plan view. The third interconnect part 137 includes a coil interconnect disposed at the same position as the first coil 41A in the z-direction and a connection interconnect connecting the coil interconnect and the second interconnect part 136. The coil interconnect is connected to the first end of the first coil 41A. The connection interconnect is disposed to overlap the coil interconnect in plan view and extends through the insulation layer 85 between the coil interconnect and the second interconnect part 136 in the z-direction.

As shown in FIG. 5, the second interconnect 132A and the first interconnect 131A have the same structure. The second interconnect 132A differs from the first interconnect 131A in that the third interconnect part 137 is connected to the second ends of the first coils 41A of the transformers 40AA and 40AB.

As shown in FIGS. 4 and 6, the third interconnect 133A connects the second electrode pads 82A to a first end of the second coil 42A of the transformer 40AA. The third interconnect 133A is disposed to overlap the second electrode pads 82A in plan view. In plan view, the third interconnect 133A is aligned with the third interconnect part 137 of the first interconnect 131A in the x-direction and is located closer to the chip side surface 80a of the transformer chip 80 in the y-direction.

The third interconnect 133B connects the second electrode pads 82C and a first end of the second coil 42A of the transformer 40AB. The third interconnect 133B is disposed to overlap the second electrode pads 82C in plan view. In plan view, the third interconnect 133B is aligned with the third interconnect part 137 of the first interconnect 131B in the x-direction and is located closer to the chip side surface 80a of the transformer chip 80 in the y-direction.

The third interconnect 133C connects the second electrode pads 82D and a first end of the second coil 42B of the transformer 40BA. The third interconnect 133C is disposed to overlap the second electrode pads 82D in plan view. In plan view, the third interconnect 133C is aligned with the third interconnect part 137 of the first interconnect 131C in the x-direction and is located closer to the chip side surface 80a of the transformer chip 80 in the y-direction.

The third interconnect 133D connects the second electrode pads 82F and a first end of the second coil 42B of the transformer 40BB. The third interconnect 133D is disposed to overlap the second electrode pads 82F in plan view. In plan view, the third interconnect 133C is aligned with the third interconnect part 137 of the first interconnect 131D in the x-direction and is located closer to the chip side surface 80a of the transformer chip 80 in the y-direction.

The fourth interconnect 134A connects the second electrode pads 82B to a second end of the second coil 42A of the transformer 40AA and a second end of the second coil 42A of the transformer 40AB. The fourth interconnect 134A is disposed between the second coil 42A of the transformer 40AA and the second coil 42A of the transformer 40AB in the x-direction. The fourth interconnect 134A is disposed to overlap the second coils 42A of the transformers 40AA and 40AB as viewed in the x-direction.

The fourth interconnect 134B connects the second electrode pads 82D to a second end of the second coil 42B of the transformer 40BA and a second end of the second coil 42B of the transformer 40BB. The fourth interconnect 134B is disposed between the second coil 42B of the transformer 40BA and the second coil 42B of the transformer 40BB in the x-direction. The fourth interconnect 134B is disposed to overlap the second coils 42B of the transformers 40BA and 40BB as viewed in the x-direction.

As shown in FIGS. 4 and 6, in the present embodiment, the transformer chip 80 includes a dummy pattern 120 arranged around the second coils 42A and 42B of the transformers 40AA, 40AB, 40BA, and 40BB.

The dummy pattern 120 is disposed in the inner region 87 and includes a first dummy pattern 121, a second dummy pattern 122, and a third dummy pattern 123. The dummy patterns 121 to 123 are formed from one or more materials selected from Ti, TiN, Au, Ag, Cu, Al, and W.

In plan view, the first dummy pattern 121 is disposed in each of a region between the second coil 42A of the transformer 40AA and the second coil 42A of the transformer 40AB in the x-direction, a region between the second coil 42B of the transformer 40BA and the second coil 42B of the transformer 40BB in the x-direction, and a region between the second coil 42B of the transformer 40AB and the second coil 42B of the transformer 40BA in the x-direction.

The first dummy pattern 121 is electrically connected to the second coil 42B by the fourth interconnect 134B. The first dummy pattern 121 may be electrically connected to the second coil 42A. In other words, the first dummy pattern 121 may be electrically connected to at least one of the second coils 42A and 42B. Thus, the first dummy pattern 121 has the same potential as the second coils 42A and 42B. Therefore, as the second reference potential of the second coils 42A and 42B changes, the voltage of the first dummy pattern 121 may become higher than that of the first coil 41B in the same manner as the second coil 42B. As shown in FIG. 6, the first dummy pattern 121 is patterned differently from the second coils 42A and 42B.

Although not shown, the first dummy pattern 121 is aligned with the second coils 42A and 42B in the z-direction. Thus, the first dummy pattern 121 is located farther from the substrate 84 than the first coils 41A and 41B are. In other words, the dummy pattern 120 is arranged around coils of the transformers 40AA, 40AB, 40BA, and 40BB located closer to the chip main surface 80s of the transformer chip 80.

The first dummy pattern 121 and the second coils 42A and 42B have the same voltage. This limits voltage drops between the first dummy pattern 121 and the second coils 42A and 42B. Thus, concentration of electric field on the second coils 42A and 42B is limited.

As shown in FIG. 6, the third dummy pattern 123 is disposed to surround the second coils 42A and 42B of the transformers 40AA, 40AB, 40BA, and 40BB in plan view. The third dummy pattern 123 is electrically connected to the first dummy pattern 121. Thus, in the third dummy pattern 123, similar to the first dummy pattern 121, as the second reference potential of the second coil 42B changes, the voltage of the third dummy pattern 123 may become higher than that of the first coil 41B.

As shown in FIG. 7, the third dummy pattern 123 is aligned with the second coil 42A in the z-direction. Although not shown, the third dummy pattern 123 is aligned with the second coil 42B in the z-direction. Thus, the third dummy pattern 123 is located farther from the substrate 84 than the first coils 41A and 41B are. As described above, the dummy patterns 121 to 123 are aligned with each other in the z-direction.

The third dummy pattern 123 and the second coils 42A and 42B have the same voltage. This limits voltage drops between the third dummy pattern 123 and the second coils 42A and 42B. Thus, concentration of electric field on the second coils 42A and 42B is limited.

The second dummy pattern 122 is disposed to surround the third dummy pattern 123 in plan view. The second dummy pattern 122 is independent of the second coils 42A and 42B. In other words, the second dummy pattern 122 is not electrically connected to the second coils 42A and 42B.

As shown in FIG. 7, the second dummy pattern 122 is aligned with the second coil 42A in the z-direction. Although not shown, the second dummy pattern 122 is aligned with the second coil 42B in the z-direction. Thus, the second dummy pattern 122 is located farther from the substrate 84 than the first coils 41A and 41B are. The second dummy pattern 122 limits an increase in the electric field strength around the second coils 42A and 42B and limits concentration of the electric field on the second electrode pads 82A to 82F.

As shown in FIG. 7, the transformer chip 80 includes a passivation layer 150 protecting the insulation layers 85. The passivation layer 150 is arranged on a surface 85s of an insulation layer 85. The surface 85s of the insulation layer 85 is the surface of the uppermost insulation layer 85U among the multiple insulation layers 85. The surface of the uppermost insulation layer 85U faces in the same direction as the substrate main surface 84s of the substrate 84. The passivation layer 150 is disposed on the transformer chip 80 close to the chip main surface 80s. Thus, in other words, the dummy pattern 120 is arranged around ones (in the present embodiment, the second coils 42A and 42B) of the first coils 41A and 41B and the second coils 42A and 42B located closer to the passivation layer 150.

The passivation layer 150 covers the electrode pads 81 and the electrode pads 82 to partially expose the electrode pads 81 and the electrode pads 82 in the z-direction. More specifically, the passivation layer 150 includes a first protection layer opening 151 exposing each electrode pad 81 and a second protection layer opening 152 exposing each electrode pads 82. The passivation layer 150 includes multiple first protection layer openings 151 corresponding to the multiple first electrode pads 81 and multiple second protection layer openings 152 corresponding to the multiple second electrode pads 82. Among the multiple first electrode pads 81, each of the first protection layer openings 151 exposes both of two first electrode pads 81 located next to each other in the x-direction. Among the multiple second electrode pads 82, each of the second protection layer openings 152 exposes both of two second electrode pads 82 located next to each other in the x-direction.

As shown in FIG. 8, the first protection layer opening 151 extends through the passivation layer 150 at a position overlapping the first electrode pad 81 in plan view. The first protection layer opening 151 is in communication with the first insulation layer opening 85Ua of the uppermost insulation layer 85U. The first protection layer opening 151 is defined by a first inner surface that is flush with, for example, a first inner surface defining the first insulation layer opening 85Ua.

As shown in FIG. 9, the second protection layer opening 152 extends through the passivation layer 150 at a position overlapping the second electrode pad 82 in plan view. The second protection layer opening 152 is in communication with the second insulation layer opening 85Ub of the uppermost insulation layer 85U. The second protection layer opening 152 is defined by a second inner surface that is flush with, for example, a second inner surface defining the second insulation layer opening 85Ub.

As shown in FIG. 7, the passivation layer 150 is disposed in the inner region 87. In plan view, the passivation layer 150 is disposed to overlap the shield electrode 86. In plan view, the passivation layer 150 extends outward slightly from the shield electrode 86. Thus, the passivation layer 150 is also disposed in a portion of the outer region 88. In the present embodiment, the passivation layer 150 entirely covers the surface 85s of the uppermost insulation layer 85U. Outer side surfaces of the passivation layer 150 are flush with outer side surfaces of the uppermost insulation layer 85U. Hence, the transformer chip 80 includes a step 88a in the outer region 88. In plan view, the step 88a is located at an outer side of the shield electrode 86.

The passivation layer 150 is formed from a material, for example, including silicon nitride. The material including silicon nitride includes, for example, SiN and SiCN. In the present embodiment, the passivation layer 150 is formed from a material including SiN.

In an example, as shown in FIG. 8, a thickness TP of the passivation layer 150 is less than or equal to a thickness TR of the insulation layer 85. The thickness TP of the passivation layer 150 is less than a thickness TRU of the uppermost insulation layer 85U. The thickness TP of the passivation layer 150 may be equal to the thickness of the first insulation layer 85A.

As shown in FIGS. 8 and 9, the passivation layer 150 includes a first bulge 153 and a second bulge 154. The first bulge 153 covers the uppermost insulation layer 85U that covers peripheral portions of the two first electrode pads 81 located next to each other in the x-direction. The second bulge 154 covers the uppermost insulation layer 85U that covers peripheral portions of the two second electrode pads 82 located next to each other in the x-direction. The first bulge 153 defines the first protection layer opening 151. The second bulge 154 defines the second protection layer opening 152. In plan view, each of the first bulge 153 and the second bulge 154 is rectangular so that the long sides extend in the x-direction and the short sides extend in the y-direction.

As shown in FIG. 7, the transformer chip 80 includes a low dielectric layer 160 disposed on a surface 150s of the passivation layer 150. In the present embodiment, the low dielectric layer 160 is in contact with the passivation layer 150. In plan view, the surface 150s of the passivation layer 150 refers to a surface of the passivation layer 150 that faces in the same direction as the substrate main surface 84s of the substrate 84.

In the present embodiment, the low dielectric layer 160 is disposed on the entire surface 150s of the passivation layer 150 in plan view. More specifically, in plan view, an outer edge of the low dielectric layer 160 is aligned with an outer edge of the passivation layer 150. Thus, as shown in FIG. 8, an outer side surface of the low dielectric layer 160 is flush with an outer side surface of the passivation layer 150.

The low dielectric layer 160 is disposed between the passivation layer 150 and the mold resin 110 in the z-direction so that the passivation layer 150 does not contact the mold resin 110. As shown in FIG. 8, a thickness TE of the low dielectric layer 160 is less than or equal to the thickness TP of the passivation layer 150. In the present embodiment, the thickness TE of the low dielectric layer 160 is less than the thickness TP of the passivation layer 150.

The thickness TE of the low dielectric layer 160 may be changed in any manner. In an example, the thickness TE of the low dielectric layer 160 may be greater than the thickness TP of the passivation layer 150.

As shown in FIGS. 8 and 9, the low dielectric layer 160 includes a first dielectric layer opening 161 located to overlap the first protection layer opening 151 in plan view and a second dielectric layer opening 162 located to overlap the second protection layer opening 152 in plan view. More specifically, the low dielectric layer 160 includes multiple first dielectric layer openings 161 corresponding to the multiple first protection layer openings 151 and multiple second dielectric layer openings 162 corresponding to the multiple second protection layer openings 152. The first dielectric layer opening 161 is in communication with the first protection layer opening 151. The second dielectric layer opening 162 is in communication with the second protection layer opening 152.

The first dielectric layer opening 161 is defined by a first inner surface that is flush with, for example, a first inner surface defining the first protection layer opening 151. The second dielectric layer opening 162 is defined by a second inner surface that is flush with a second inner surface defining the second protection layer opening 152.

As described above, in the present embodiment, the transformer chip 80 includes a first opening 171 that includes the first insulation layer opening 85Ua, the first protection layer opening 151, and the first dielectric layer opening 161 and a second opening 172 that includes the second insulation layer opening 85Ub, the second protection layer opening 152, and the second dielectric layer opening 162. In the present embodiment, the first opening 171 and the second opening 172 extend through both the passivation layer 150 and the low dielectric layer 160. In addition, the first opening 171 and the second opening 172 extend through the uppermost insulation layer 85U. Thus, the first opening 171 exposes the first electrode pads 81 in the z-direction. The second opening 172 exposes the second electrode pads 82 in the z-direction. A wire W (not shown in FIGS. 7 and 8) is connected to the first electrode pad 81 through the first opening 171. A wire W (not shown in FIGS. 7 and 9) is connected to the second electrode pad 82 through the second opening 172.

As shown in FIGS. 8 and 9, the low dielectric layer 160 includes a first bulge 163 and a second bulge 164. The first bulge 163 covers the first bulge 153 of the passivation layer 150. The second bulge 164 covers the second bulge 154.

As described above, the first opening 171 is defined by the uppermost insulation layer 85U, the passivation layer 150, and the low dielectric layer 160. Thus, a first bulge 173 is arranged around the first opening 171 to cover peripheral portions of two first electrode pads 81 located next to each other in the x-direction. The first bulge 173 includes a portion of the uppermost insulation layer 85U covering peripheral portions of the two first electrode pads 81, the first bulge 153 of the passivation layer 150, and the first bulge 163 of the low dielectric layer 160.

The second opening 172 is defined by the uppermost insulation layer 85U, the passivation layer 150, and the low dielectric layer 160. Thus, a second bulge 174 is arranged around the second opening 172 to cover peripheral potions of the two second electrode pads 82 located next to each other the x-direction. The second bulge 174 includes a portion of the uppermost insulation layer 85U covering peripheral portions of the two second electrode pads 82, the second bulge 154 of the passivation layer 150, and the second bulge 164 of the low dielectric layer 160.

As shown in FIGS. 7 to 9, the transformer chip 80 includes a resin layer 180 disposed on the low dielectric layer 160. The resin layer 180 is in contact with the low dielectric layer 160. The resin layer 180 is formed from a material including, for example, polyimide (PI). The resin layer 180 reduces stress between the mold resin 110 and the insulation layers 85 and between the mold resin 110 and the substrate 84. Outer side surfaces of the resin layer 180 are flush with outer side surfaces of the low dielectric layer 160.

As shown in FIG. 8, a thickness TD of the resin layer 180 is greater than the thickness TE of the low dielectric layer 160. In other words, the thickness TE of the low dielectric layer 160 is less than the thickness TD of the resin layer 180. The thickness TD of the resin layer 180 is greater than the thickness TRU of the uppermost insulation layer 85U and the thickness TP of the passivation layer 150.

Figure 3:
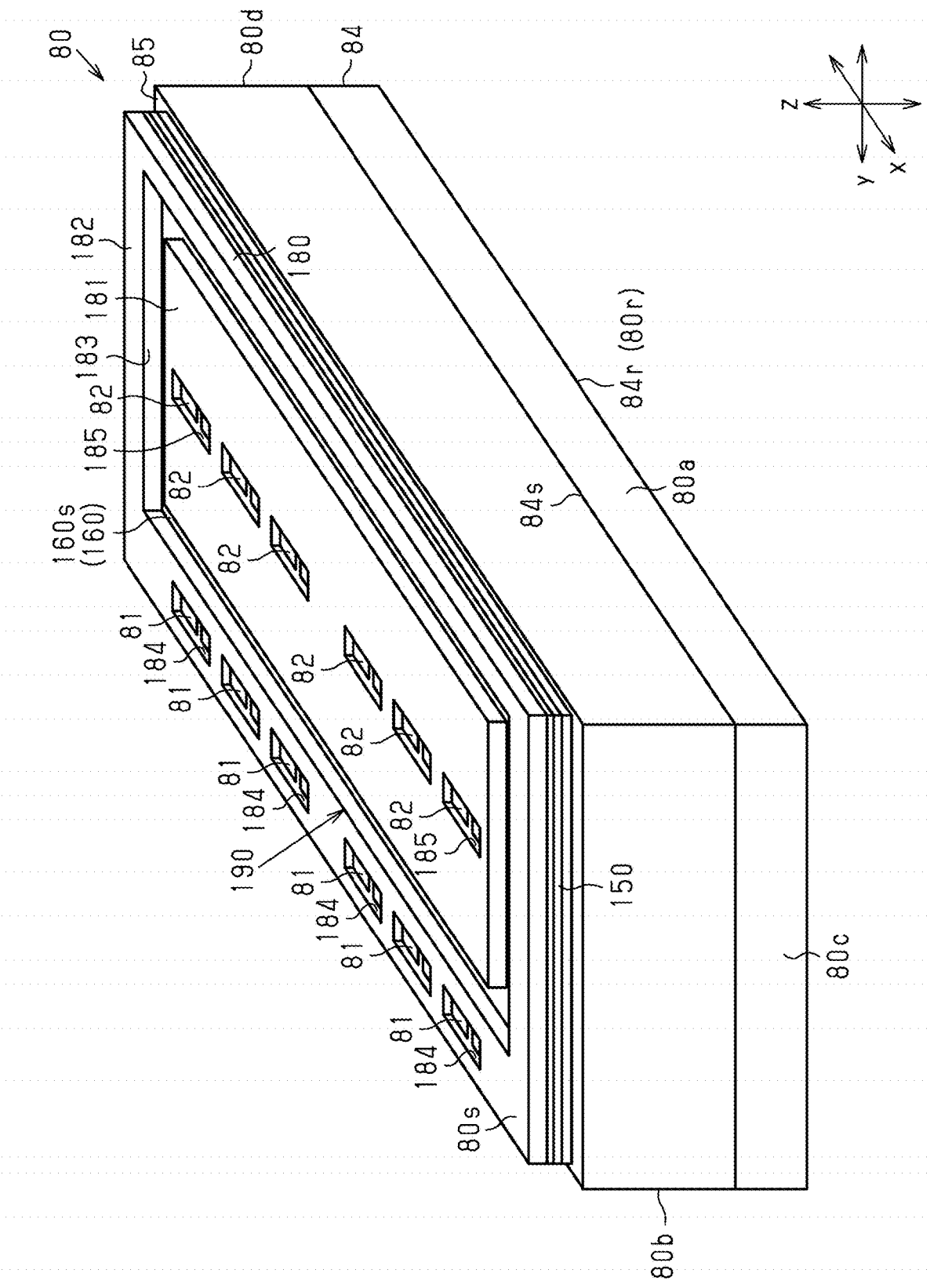
FIG. 3 is a perspective view showing a transformer chip included in the gate driver of the first embodiment.

As shown in FIGS. 3 and 4, the resin layer 180 is separated by a separation groove 183 into an inner resin layer 181 and an outer resin layer 182. In plan view, the separation groove 183 surrounds the transformers 40AA, 40AB, 40BA, and 40BB. Thus, in plan view, the inner resin layer 181 includes a region overlapping the transformers 40AA, 40AB, 40BA, and 40BB. More specifically, as shown in FIG. 7, the inner resin layer 181 includes a region overlapping the dummy pattern 120 in plan view. In plan view, the inner resin layer 181 surrounds two second electrode pads 82 located next to each other in the x-direction. In plan view, the outer resin layer 182 includes a peripheral region of the low dielectric layer 160. In plan view, the outer resin layer 182 surrounds two first electrode pads 81 located next to each other in the x-direction. The low dielectric layer 160 includes a surface 160s exposing from the resin layer 180 in the z-direction in the separation groove 183. In plan view, the separation groove 183 is looped and rectangular so that the long sides extend in the x-direction and the short sides extend in the y-direction. In the present embodiment, the separation groove 183 corresponds to a "groove that exposes the surface of the low dielectric layer."

Thus, in the present embodiment, a region of the surface 160s of the low dielectric layer 160 between the first electrode pad 81 and the second electrode pad 82 includes an irregular structure 190. The irregular structure 190 of the present embodiment includes the inner resin layer 181, the outer resin layer 182, and the separation groove 183. More specifically, the irregular structure 190 is formed by an interface between the low dielectric layer 160 and the mold resin 110 and an interface between the resin layer 180 and the mold resin 110. More specifically, the irregular structure 190 is formed by an interface between the low dielectric layer 160 and the mold resin 110 located in an opening 184, an interface between the inner resin layer 181 and the mold resin 110, an interface between the resin layer 180 and the mold resin 110 and an interface between the low dielectric layer 160 and the mold resin 110 in the separation groove 183, and an interface between the outer resin layer 182 and the mold resin 110.

The separation groove 183 may include multiple separation grooves separated from each other. In this structure, the number of irregularities of the irregular structure 190 is increased. This increases the creepage distance between the first electrode pad 81 and the second electrode pad 82.

As shown in FIGS. 8 and 9, the resin layer 180 includes a first resin layer opening 184 located to overlap the first opening 171 in plan view and a second resin layer opening 185 located to overlap the second opening 172 in plan view. More specifically, the resin layer 180 includes multiple first resin layer openings 184 corresponding to multiple first openings 171 and multiple second resin layer openings 185 corresponding to multiple second openings 172.

The first resin layer opening 184 is greater in area than the first opening 171. The first resin layer opening 184 accommodates the first bulge 173. In plan view, the first resin layer opening 184 is defined by a wall surface located at an outer side of the first bulge 173. Thus, the first bulge 173 is exposed from the resin layer 180 in the z-direction. In plan view, a portion of the surface 160s of the low dielectric layer 160 located in the first resin layer opening 184 is exposed from the first resin layer opening 184 in the z-direction. The portion of the surface 160s of the low dielectric layer 160 located in the first resin layer openings 184 includes the first bulge 173 and its surroundings of the surface 160s of the low dielectric layer 160.

The second resin layer opening 185 is greater in area than the second opening 172. The second resin layer opening 185 accommodates the second bulge 174. In plan view, the first resin layer opening 184 is defined by a wall surface located at an outer side of the second bulge 174. Thus, the second bulge 174 is exposed from the resin layer 180 in the z-direction. In plan view, a portion of the surface 160s of the low dielectric layer 160 located in the second resin layer opening 185 is exposed from the second resin layer opening 185 in the z-direction. The portion of the surface 160s of the low dielectric layer 160 located in the second resin layer openings 185 includes the second bulge 174 and its surroundings of the surface 160s of the low dielectric layer 160.

The first resin layer opening 184 is in communication with the first dielectric layer opening 161. The second resin layer opening 185 is in communication with the second dielectric layer opening 162. Thus, each first electrode pad 81 is exposed from the transformer chip 80 in the z-direction through the first dielectric layer opening 161, the first protection layer opening 151, and the first resin layer opening 184. Each second electrode pad 82 is exposed from the transformer chip 80 in the z-direction through the second dielectric layer opening 162, the second protection layer opening 152, and the second resin layer opening 185.

The mold resin 110 of the gate driver 10 covers the transformer chip 80. More specifically, as shown in FIG. 7, the mold resin 110 covers the resin layer 180. The resin layer 180 covers side surfaces of the passivation layer 150, the low dielectric layer 160, and the resin layer 180. The mold resin 110 is disposed in the separation groove 183. Thus, the mold resin 110 is in contact with the surface 160s of the low dielectric layer 160 in the separation groove 183. The mold resin 110 fills the separation groove 183. The mold resin 110 is in contact with an outer side surface of the inner resin layer 181 and an inner side surface of the outer resin layer 182 of the resin layer 180 defining the separation groove 183.

The mold resin 110 is also disposed in each first resin layer opening 184 and each second resin layer opening 185. Thus, the mold resin 110 is in contact with the surface 160s of the low dielectric layer 160 in the first resin layer opening 184 and the second resin layer opening 185. The mold resin 110 fills the first resin layer opening 184 and the second resin layer opening 185. Thus, the mold resin 110 is in contact with a first inner surface of the resin layer 180 defining the first resin layer opening 184 and a second inner surface of the resin layer 180 defining the second resin layer opening 185.

The mold resin 110 is also disposed in each first opening 171 and each second opening 172. Thus, the mold resin 110 is in contact with the first electrode pads 81 through the first opening 171 and the second electrode pads 82 through the second opening 172.

In the present embodiment, the mold resin 110 is disposed in each first opening 171 and is in contact with the two first electrode pads 81 exposed from the first opening 171. The mold resin 110 fills each first opening 171. Thus, in each first opening 171, the mold resin 110 is in contact with the first inner surface of the first insulation layer opening 85Ua, the first inner surface of the first protection layer opening 151, and the first inner surface of the first dielectric layer opening 161, defining the first opening 171.

In the present embodiment, the mold resin 110 is disposed in each second opening 172 and is in contact with the two second electrode pads 82 exposed from the second opening 172. The mold resin 110 fills each second opening 172. Thus, in each second opening 172, the mold resin 110 is in contact with the second inner surface of the second insulation layer opening 85Ub, the second inner surface of the second protection layer opening 152, and the second inner surface of the second dielectric layer opening 162, defining the second opening 172.

The relationship of the permittivity among the insulation layer 85, the passivation layer 150, the low dielectric layer 160, the resin layer 180, and the mold resin 110 will now be described.

In the present embodiment, the insulation layer 85 is formed from a material including $SiO_2$. The permittivity of the insulation layer 85 is approximately 4.1. The passivation layer 150 is formed from a material including SiN. The permittivity of the passivation layer 150 is approximately 7.0. Therefore, the permittivity of the passivation layer 150 is greater than the permittivity of the insulation layers 85.

In the present embodiment, the resin layer 180 is formed from a material including polyimide. The permittivity of the resin layer 180 is approximately 2.9.

In the present embodiment, the mold resin 110 is formed from a material including an epoxy resin. The permittivity of the mold resin 110 is approximately 3.9. Therefore, the permittivity of the mold resin 110 is less than the permittivity of the passivation layer 150. The permittivity of the mold resin 110 is greater than the permittivity of the resin layer 180.

The low dielectric layer 160 has a lower permittivity than the passivation layer 150. In an example, the permittivity of the low dielectric layer 160 is less than or equal to the permittivity of the insulation layer 85. More specifically, the permittivity of the low dielectric layer 160 is less than the permittivity of the first insulation layer 85A of the insulation layers 85. The low dielectric layer 160 is less than or equal to the dielectric layer of the second insulation layer 85B of the insulation layer 85. The permittivity of the low dielectric layer 160 may be less than or equal to the permittivity of the mold resin 110.

The low dielectric layer 160 may be formed from a material including, for example, $SiO_2$. That is, the low dielectric layer 160 and the second insulation layer 85B of the insulation layers 85 may be formed from the same material. The permittivity of the low dielectric layer 160 may be less than the permittivity of the insulation layer 85. The low dielectric layer 160 may be formed from a low-K film. The low-K film is selected from, for example, silicon oxycarbide film (SiOC), fluorinated silicon oxide film (SiOF), a porous film, and the like. When the low dielectric layer 160 is formed from SiOC, the permittivity of the low dielectric layer 160 is greater than or equal to 2.5 and less than or equal to 3.0. When the low dielectric layer 160 is formed from SiOF, the permittivity of the low dielectric layer 160 is greater than or equal to 3.4 and less than or equal to 3.8. When the low dielectric layer 160 is formed from a porous film, the permittivity of the low dielectric layer 160 is less than 2.5. As described above, when a low-K film is used as the low dielectric layer 160, the permittivity of the low dielectric layer 160 is less than the permittivity of the insulation layer 85 and the mold resin 110.

An example of a method for manufacturing the gate driver 10 of the present embodiment will now be described.

The low-voltage circuit chip 60, the high-voltage circuit chip 70, and the transformer chip 80 are prepared. A method for manufacturing the transformer chip 80 includes a step of preparing the substrate 84, a step of forming the insulation layers 85 on the substrate 84, a step of embedding the transformers 40 and the dummy patterns 120 in the insulation layers 85, a step of forming the first electrode pads 81 and the second electrode pads 82, a step of embedding the shield electrode 86, a step of forming the passivation layer 150, a step of forming the low dielectric layer 160, a step of forming the first openings 171 and the second openings 172, and a step of forming the resin layer 180.

In the step of forming the first openings 171 and the second openings 172, the passivation layer 150 is formed on the uppermost insulation layer 85U among the insulation layers 85. The low dielectric layer 160 is formed on the passivation layer 150. The first openings 171 and the second openings 172 are formed to extend through the uppermost insulation layer 85U, the passivation layer 150, and the low dielectric layer 160 in the z-direction.

In the step of forming the resin layer 180, the resin layer 180 is formed with the first openings 171 and the second openings 172 masked. The mask is removed from the first openings 171 and the second openings 172. The steps described above manufacture the transformer chip 80.

Next, a lead frame on which the low-voltage die pad 91 and the low-voltage leads 92 are formed and the high-voltage die pad 101 and the high-voltage leads 102 are formed is prepared. In this step, the low-voltage leads 92 and the high-voltage leads 102 are integrated with the lead frame.

The low-voltage circuit chip 60 and the transformer chip 80 are, for example, die-bonded to the low-voltage die pad 91. The high-voltage circuit chip 70 is, for example, die-bonded to the high-voltage die pad 101. Next, a wire bonder is used to form wires W connecting the electrode pads 61 and 63 of the low-voltage circuit chip 60 to the low-voltage leads 92, wires W connecting the second electrode pads 62 of the low-voltage circuit chip 60 to the first electrode pads 81 of the transformer chip 80, wires W connecting the second electrode pads 82 of the transformer chip 80 to the first electrode pads 71 of the high-voltage circuit chip 70, and wires W connecting the electrode pads 72 and 73 of the high-voltage circuit chip 70 to the high-voltage leads 102.

An encapsulation layer is formed to encapsulate at least the low-voltage die pad 91, the high-voltage die pad 101, the low-voltage circuit chip 60, the high-voltage circuit chip 70, the transformer chip 80, and the wires W. The encapsulation layer is formed from, for example, a black epoxy resin by compression molding.

The encapsulation layer and the lead frame are cut. This forms the mold resin 110, the low-voltage leads 92, and the high-voltage leads 102. The steps described above manufacture the gate driver 10.

Operation of First Embodiment

The operation of the gate driver 10 according to the present embodiment will now be described. In the description hereafter, a transformer chip that does not include the low dielectric layer 160 of the transformer chip 80 of the gate driver 10 is referred to as a comparative example of a transformer chip.

The transformer chip of the comparative example includes a portion where the passivation layer 150 is exposed from the resin layer 180. Thus, the transformer chip of the comparative example includes a portion in which the passivation layer 150 is in contact with the mold resin 110. When the transformer chip 80 is encapsulated by the mold resin 110, the mold resin 110 has a void during formation of the mold resin 110. The void may be present in an interface portion between the mold resin 110 and the passivation layer 150. In such a state, if a high voltage is applied to the transformer chip of the comparative example, partial discharge may occur through the void that is present in the interface portion between the mold resin 110 and the passivation layer 150. The partial discharge may cause creepage discharge to occur along the interface portion between the mold resin 110 and the passivation layer 150. Regarding such a discharge, the inventor of the present application has found that as the permittivity of a layer that is in contact with the mold resin 110 increases, partial discharge starts to occur at a lower voltage. Thus, the partial discharge and creepage discharge are more likely to occur. In the transformer chip of the comparative example, the passivation layer 150, which is in contact with the mold resin 110, is formed from a material including SiN, and the permittivity of the passivation layer 150 is 7.0 and is greater than other layers. Therefore, partial discharge starts to occur at a lower voltage, and partial discharge and creepage discharge are more likely to occur.

The inventor of the present application has found that the passivation layer 150 may be covered by a layer having a lower permittivity than the passivation layer 150 so that the passivation layer 150 does not contact the mold resin 110. In the present embodiment, the transformer chip 80 includes the low dielectric layer 160 covering the passivation layer 150. The low dielectric layer 160 is in contact with the mold resin 110. This limits contact of the mold resin 110 with the passivation layer 150. As a result, occurrence of partial discharge caused by contact of the mold resin 110 with the passivation layer 150 and presence of a void in the interface portion between the mold resin 110 and the passivation layer 150 are limited. Ultimately, occurrence of creepage discharge is limited. In addition, the low dielectric layer 160 has a lower permittivity than the passivation layer 150. Thus, the voltage at which partial discharge starts to occur in the interface portion between the low dielectric layer 160 and the mold resin 110 is higher than the voltage at which partial discharge starts to occur in the interface portion between the passivation layer 150 and the mold resin 110. This limits occurrence of partial discharge caused by a void present in the interface portion between the mold resin 110 and the low dielectric layer 160 and ultimately limits occurrence of creepage discharge.

Advantages of First Embodiment

The gate driver 10 of the present embodiment obtains the following advantages.

(1-1) The transformer chip 80 includes the first coils 41A and 41B, the second coils 42A and 42B, the first electrode pads 81 connected to the first coils 41A and 41B, the second electrode pads 82 connected to the second coils 42A and 42B and spaced apart from the first electrode pads 81 in plan view, the passivation layer 150 arranged on the surface 85s of the insulation layers 85 and protecting the insulation layers 85, and the low dielectric layer 160 arranged on the surface 150s of the passivation layer 150 and having a lower permittivity than the passivation layer 150. The low dielectric layer 160 is covered by the mold resin 110.

In this structure, the low dielectric layer 160 is disposed between the passivation layer 150 and the mold resin 110 to limit contact of the passivation layer 150 with the mold resin 110. This limits occurrence of partial discharge caused by a void present in the interface portion between the mold resin 110 and the passivation layer 150 and ultimately limits occurrence of creepage discharge. Thus, the reliability of the transformer chip 80 is increased.

(1-2) The permittivity of the low dielectric layer 160 is less than or equal to the permittivity of the mold resin 110.

This structure increases the voltage at which partial discharge starts to occur in the interface portion between the low dielectric layer 160 and the mold resin 110, thereby limiting occurrence of partial discharge caused by a void present in the interface portion between the low dielectric layer 160 and the mold resin 110 and ultimately limiting occurrence of creepage discharge.

(1-3) The thickness TE of the low dielectric layer 160 is less than or equal to the thickness TP of the passivation layer 150. This structure limits increases in the size of the transformer chip 80 in the z-direction.

(1-4) When the gate driver 10 is driven, a high voltage is applied to the second electrode pads 82 of the transformer chip 80 and forms a high electric field around the second electrode pads 82. Although the low dielectric layer 160 limits occurrence of creepage discharge, creepage discharge is likely to occur in the interface portion between the low dielectric layer 160 and the mold resin 110 around the second electrode pads 82 as compared to other interface portions. When creepage discharge occurs from the second electrode pad 82 toward the first electrode pad 81, if the creepage distance between the second electrode pad 82 and the first electrode pad 81 is short, the second electrode pad 82 and the first electrode pad 81 may become electrically connected.

In the present embodiment, the irregular structure 190 is arranged on the surface 160s of the low dielectric layer 160 between the first electrode pad 81 and the second electrode pad 82. This increases the creepage distance between the first electrode pad 81 and the second electrode pad 82. Thus, even when creepage discharge occurs in the interface portion between the low dielectric layer 160 and the mold resin 110, the first electrode pad 81 is less likely to be electrically connected to the second electrode pad 82.

(1-5) In plan view, the dummy pattern 120 is arranged around the second coils 42A and 42B.

This structure reduces concentration of an electric field on the second coils 42A and 42B, thereby limiting occurrence of partial discharge caused by a void in the interface portion between the low dielectric layer 160 and the mold resin 110 in the vicinity of the second coils 42A and 42B and ultimately limiting occurrence of creepage discharge.

(1-6) The gate driver 10 includes the low-voltage circuit 20 configured to be actuated by application of the first voltage V1, the high-voltage circuit 30 configured to be actuated by application of the second voltage V2 that is higher than the first voltage V1, and the transformer chip 80. The low-voltage circuit 20 and the high-voltage circuit 30 are connected by the transformer chip 80 and configured to transmit a signal through the transformer chip 80. The transformer chip 80 includes the first coils 41A and 41B, the second coils 42A and 42B, the first electrode pads 81 connected to the first coils 41A and 41B, the second electrode pads 82 connected to the second coils 42A and 42B and spaced apart from the first electrode pads 81 in plan view, the passivation layer 150 arranged on the surface 85s of the insulation layers 85 and protecting the insulation layers 85, and the low dielectric layer 160 arranged on the surface 150s of the passivation layer 150 and having a lower permittivity than the surface 150s of the passivation layer 150. The low dielectric layer 160 is covered by the mold resin 110. This structure obtains the advantage (1-1) described above. Thus, the gate driver 10 having a high reliability is obtained.

(1-7) When the gate driver 10 includes a transformer 40, for example, the gate driver 10 may have a structure in which a low-voltage circuit chip includes the low-voltage circuit 20 and the transformer 40 or a structure in which a high-voltage circuit chip includes the high-voltage circuit 30 and a transformer 40. In such structures, when the circuit configuration of the low-voltage circuit 20 or the high-voltage circuit 30 is changed, the corresponding chip entirely needs to be changed. This increases costs when different types of gate drivers are manufactured.

In the present embodiment, the transformer 40 is included in the transformer chip 80, which is independent of the low-voltage circuit chip 60 and the high-voltage circuit chip 70. That is, the chip is dedicated to the transformer 40. This allows the common transformer chip 80 to be used for the low-voltage circuit 20 and the high-voltage circuit 30, which differ from each other. As a result, costs are reduced when manufacturing different types of gate drivers 10 that differ in at least one of the low-voltage circuit 20 and the high-voltage circuit 30.

Second Embodiment

A second embodiment of a gate driver 10 will be described with reference to FIG. 10. The gate driver 10 of the present embodiment differs from the gate driver 10 of the first embodiment in the shape of the low dielectric layer 160 of the transformer chip 80. In the following description, the differences from the gate driver 10 of the first embodiment will be described in detail. The same reference characters are given to those components that are the same as the corresponding components of the gate driver 10 of the first embodiment. Such components will not be described in detail.

Figure 10:
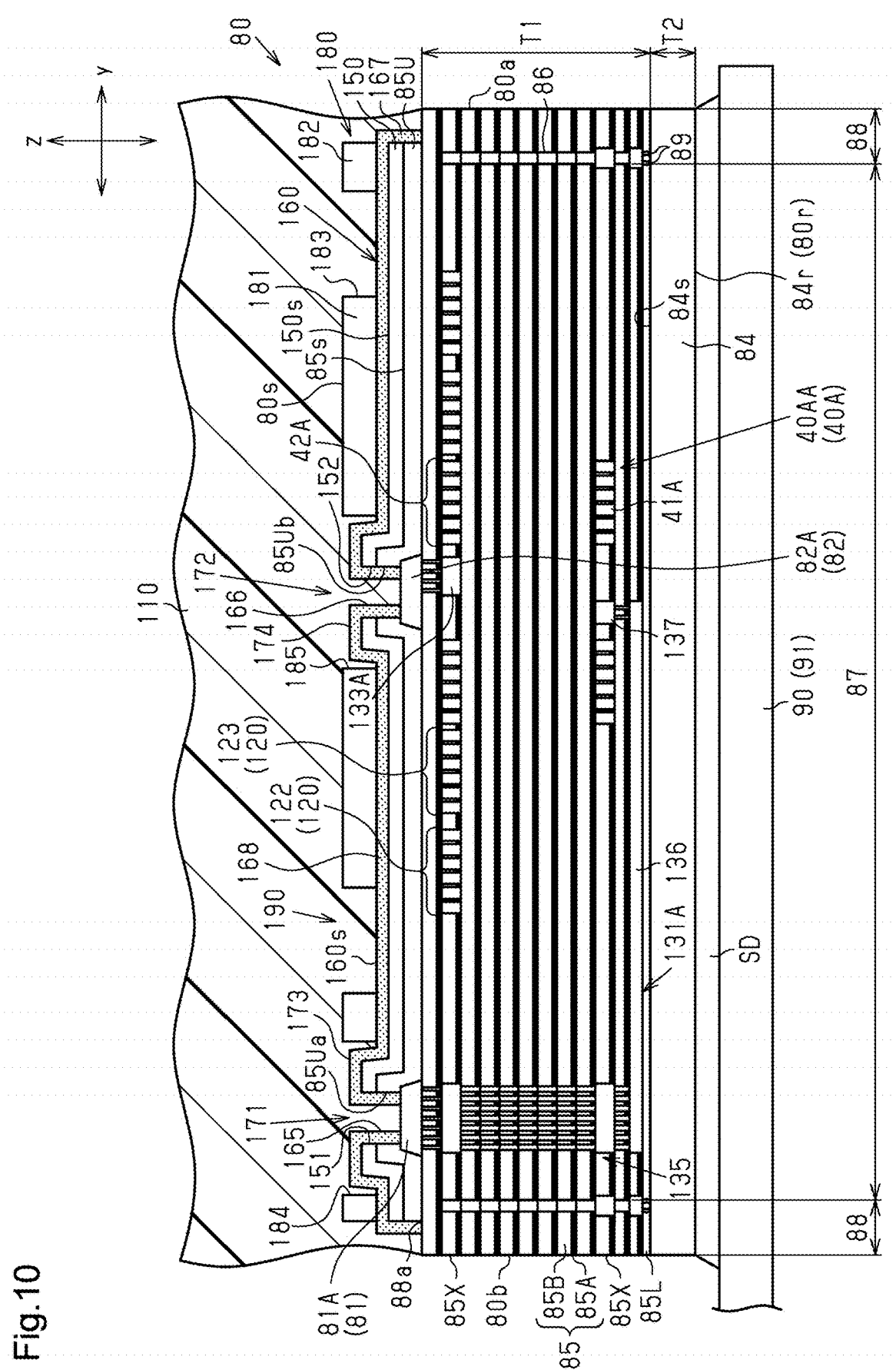
FIG. 10 is a cross-sectional view of a transformer chip mounted on a low-voltage die pad in a second embodiment of a gate driver.

As shown in FIG. 10, as compared to the low dielectric layer 160 of the first embodiment, the low dielectric layer 160 of the present embodiment further includes a first inner cover 165, a second inner cover 166, and an outer side cover 167. In the present embodiment, in plan view, the portion of the low dielectric layer 160 that covers the passivation layer 150 is referred to as a main cover 168. In the low dielectric layer 160 of the present embodiment, the first inner cover 165, the second inner cover 166, the outer side cover 167, and the main cover 168 are integrated with each other.

In the present embodiment, the first opening 171 is defined by the first protection layer opening 151 of the passivation layer 150 and the first insulation layer opening 85Ua of the uppermost insulation layer 85U. The second opening 172 is defined by the second protection layer opening 152 of the passivation layer 150 and the second insulation layer opening 85Ub of the uppermost insulation layer 85U. The uppermost insulation layer 85U includes the first inner surface defining the first insulation layer opening 85Ua and the second inner surface defining the second insulation layer opening 85Ub. The passivation layer 150 includes the first inner surface defining the first protection layer opening 151 and the second inner surface defining the second protection layer opening 152. In the present embodiment, the first inner surface defining the first protection layer opening 151 corresponds to a "first inner surface of a first opening." The second inner surface defining the second protection layer opening 152 corresponds to a "second inner surface of a second opening."

The first inner cover 165 is disposed on the first inner surface of the first protection layer opening 151. In other words, the first inner cover 165 covers the first inner surface of the first protection layer opening 151. In the present embodiment, the first inner cover 165 includes a distal surface that is in contact with the first electrode pad 81. In other words, the first inner cover 165 is disposed on the first inner surface of the first opening 171. In the present embodiment, the first inner cover 165 includes a distal surface that is in contact with the first electrode pad 81.

As described above, in the present embodiment, the first electrode pad 81 is open in the z-direction through the first dielectric layer opening 161. The first dielectric layer opening 161 is defined by the first inner cover 165. Although not shown, a wire W is connected to the first electrode pad 81 through the first dielectric layer opening 161.

The second inner cover 166 is disposed on the second inner surface of the second protection layer opening 152. In other words, the second inner cover 166 covers the second inner surface of the second protection layer opening 152. In the present embodiment, the second inner cover 166 includes a distal surface that is in contact with the second electrode pad 82. In other words, the second inner cover 166 is disposed on the second inner surface of the second opening 172.

As described above, in the present embodiment, the second electrode pad 82 is open in the z-direction through the second dielectric layer opening 162. The second dielectric layer opening 162 is defined by the second inner cover 166. Although not shown, a wire W is connected to the second electrode pad 82 through the second dielectric layer opening 162.

The outer side cover 167 is arranged on the outer side surface of the passivation layer 150 located in the outer region 88. In other words, the outer side cover 167 covers the outer side surface of the passivation layer 150 located in the outer region 88. The outer side surface of the passivation layer 150 includes the step 88a. More specifically, the outer side cover 167 covers the entire outer side surface of the passivation layer 150. In other words, the low dielectric layer 160 covers an end surface of the passivation layer 150.

As described above, in the present embodiment, the low dielectric layer 160 is configured to limit contact of the passivation layer 150 with the mold resin 110. This limits formation of a void between the passivation layer 150 and the mold resin 110. As a result, occurrence of partial discharge caused by the void is limited.

In the present embodiment, the outer side cover 167 includes a distal surface that is in contact with a surface of the insulation layer 85 located directly below the uppermost insulation layer 85U among the insulation layers 85. More specifically, the outer side cover 167 covers the entire outer side surface of the uppermost insulation layer 85U.

An example of a method for manufacturing the gate driver 10 of the present embodiment will now be described. The method for manufacturing the gate driver 10 of the present embodiment differs from that of the gate driver 10 of the first embodiment in the method of forming the openings 171 and 172 of the transformer chip 80 and the low dielectric layer 160. The method for forming each of the openings 171 and 172 of the transformer chip 80 and the low dielectric layer 160 will be described.

In the step of forming the openings 171 and 172 in the transformer chip 80, which differs from the first embodiment, the passivation layer 150 is formed on the uppermost insulation layer 85U, and then the openings 171 and 172 extending through the passivation layer 150 are formed.

Then, the low dielectric layer 160 is formed on the passivation layer 150. In this case, the low dielectric layer 160 is partially formed in the openings 171 and 172. The low dielectric layer 160 formed in the openings 171 and 172 is partially removed so that the electrode pads 81 and 82 are exposed in the z-direction. This forms the first inner cover 165 and the second inner cover 166.

The low dielectric layer 160 is also partially formed on the step 88a of the outer region 88. The low dielectric layer 160 formed on the step 88a is partially removed from the uppermost insulation layer 85 among the insulation layers 85. This forms the outer side cover 167. The steps described above form the low dielectric layer 160.

Advantages of Second Embodiment

The gate driver 10 of the present embodiment obtains the following advantages in addition to the advantages of the first embodiment.

(2-1) The low dielectric layer 160 is disposed in the first inner surface defining the first opening 171 and the second inner surface defining the second opening 172. The low dielectric layer 160 covers the end surface of the passivation layer 150.

In this structure, the passivation layer 150 defining the openings 171 and 172 and the outer side surface of the passivation layer 150 are covered by the low dielectric layer 160. This further limits direct contact of the passivation layer 150 with the mold resin 110. When a high voltage is applied to the transformer chip 80, occurrence of partial discharge and creepage discharge is further limited.

Third Embodiment

A third embodiment of a gate driver 10 will be described with reference to FIGS. 11 to 13. The gate driver 10 of the present embodiment differs from the gate driver 10 of the first embodiment in the insulation structure of a transformer. In the following description, the differences from the gate driver 10 of the first embodiment will be described in detail. The same reference characters are given to those components that are the same as the corresponding components of the gate driver 10 of the first embodiment. Such components will not be described in detail. In FIG. 13, for the sake of convenience, the coils of each transformer, the shape of a dummy pattern, and the shield electrode are shown in a simpler manner than the first embodiment, and the connection structure between each electrode pad and the coil is not shown in detail.

Figure 11:
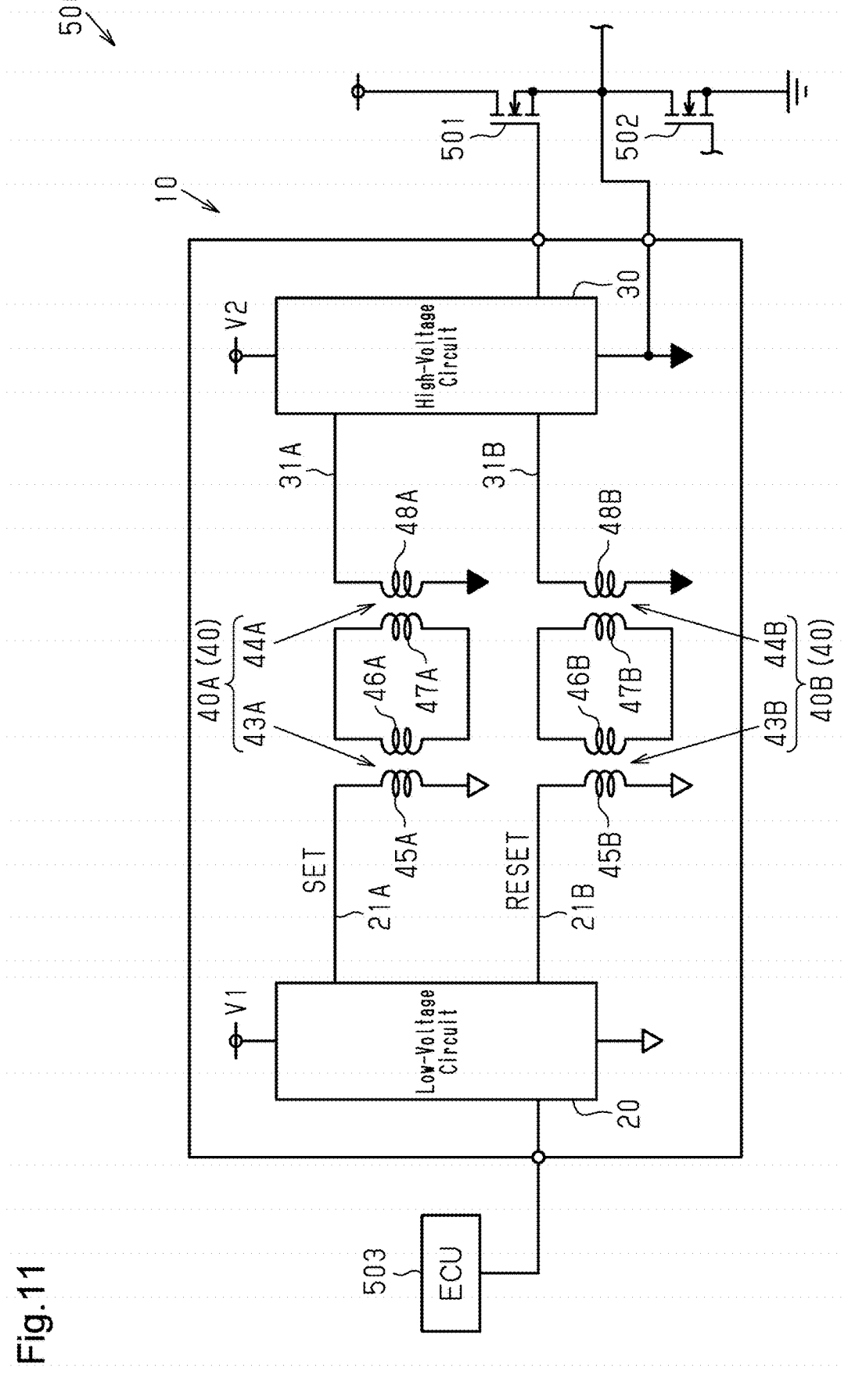
FIG. 11 is a schematic circuit diagram showing a third embodiment of a gate driver.

As shown in FIG. 11, the gate driver 10 of the present embodiment includes multiple transformers having a double insulation structure. More specifically, the transformer 40A includes a first transformer 43A and a second transformer 44A connected in series to each other. The transformer 40B includes a first transformer 43B and a second transformer 44B connected in series. As described above, each of the transformers 40A and 40B has a double insulation structure. Thus, the insulation voltage of the gate driver 10 is greater than that in the first and second embodiments and is, for example, approximately 7500 Vrms.

The first transformer 43A is electrically connected to the low-voltage circuit 20. The first transformer 43A includes a first coil 45A and a second coil 46A that is insulated from and configured to be magnetically coupled to the first coil 45A.

The second transformer 44A is electrically connected to the high-voltage circuit 30. The second transformer 44A connects the first transformer 43A and the high-voltage circuit 30. The second transformer 44A includes a first coil 47A and a second coil 48A that is insulated from and configured to be magnetically coupled to the first coil 47A. The first coil 45A is electrically connected to the low-voltage circuit 20 by the low-voltage signal line 21A and is also connected to the ground of the low-voltage circuit 20. More specifically, the first coil 45A includes a first end electrically connected to the low-voltage circuit 20 and a second end electrically connected to the ground of the low-voltage circuit 20. Thus, the potential of the second end of the first coil 45A equals the first reference potential. The first reference potential is, for example, 0 V.

The second coil 46A is connected to the first coil 47A of the second transformer 44A. In an example, the second coil 46A and the first coil 47A are connected to each other so as to be electrically floating. More specifically, the second coil 46A includes a first end connected to a first end of the first coil 47A and a second end connected to a second end of the first coil 47A. Thus, the second coil 46A and the first coil 47A serve as relay coils that relay transmission of a set signal from the first coil 45A to the second coil 48A.

The second coil 48A is electrically connected to the high-voltage circuit 30 by the high-voltage signal line 31A and is also connected to the ground of the high-voltage circuit 30. More specifically, the second coil 48A includes a first end connected to the high-voltage circuit 30 and a second end connected to the ground of the high-voltage circuit 30. Thus, the potential of the second end of the second coil 48A equals the second reference potential. The second reference potential varies as the inverter device 500 is driven and becomes, for example, greater than or equal to 600 V.

The coils 45A and 46A of the first transformer 43A and the coils 47A and 48A of the second transformer 44A are each elliptical and spiral in plan view (refer to FIG. 12) as in the first embodiment. The winding direction of the coils 45A and 46A of the first transformer 43A is opposite to the winding direction of the coils 47A and 48A of the second transformer 44A. The winding direction of each of the coils 45A, 46A, 47A, and 48A may be changed in any manner. In an example, the winding direction of the coils 45A and 46A may be the same as the winding direction of the coils 47A and 48A.

The first transformer 43B of the transformer 40B includes a first coil 45B electrically connected to the low-voltage circuit 20 and a second coil 46B insulated from and configured to be magnetically coupled to the first coil 45B.

The second transformer 44B of the transformer 40B includes a first coil 47B electrically connected to the high-voltage circuit 30 and a second coil 48B insulated from and configured to be magnetically coupled to the first coil 47B. The transformer 40B is the same as the transformer 40A and thus will not be described in detail.

Figure 12:
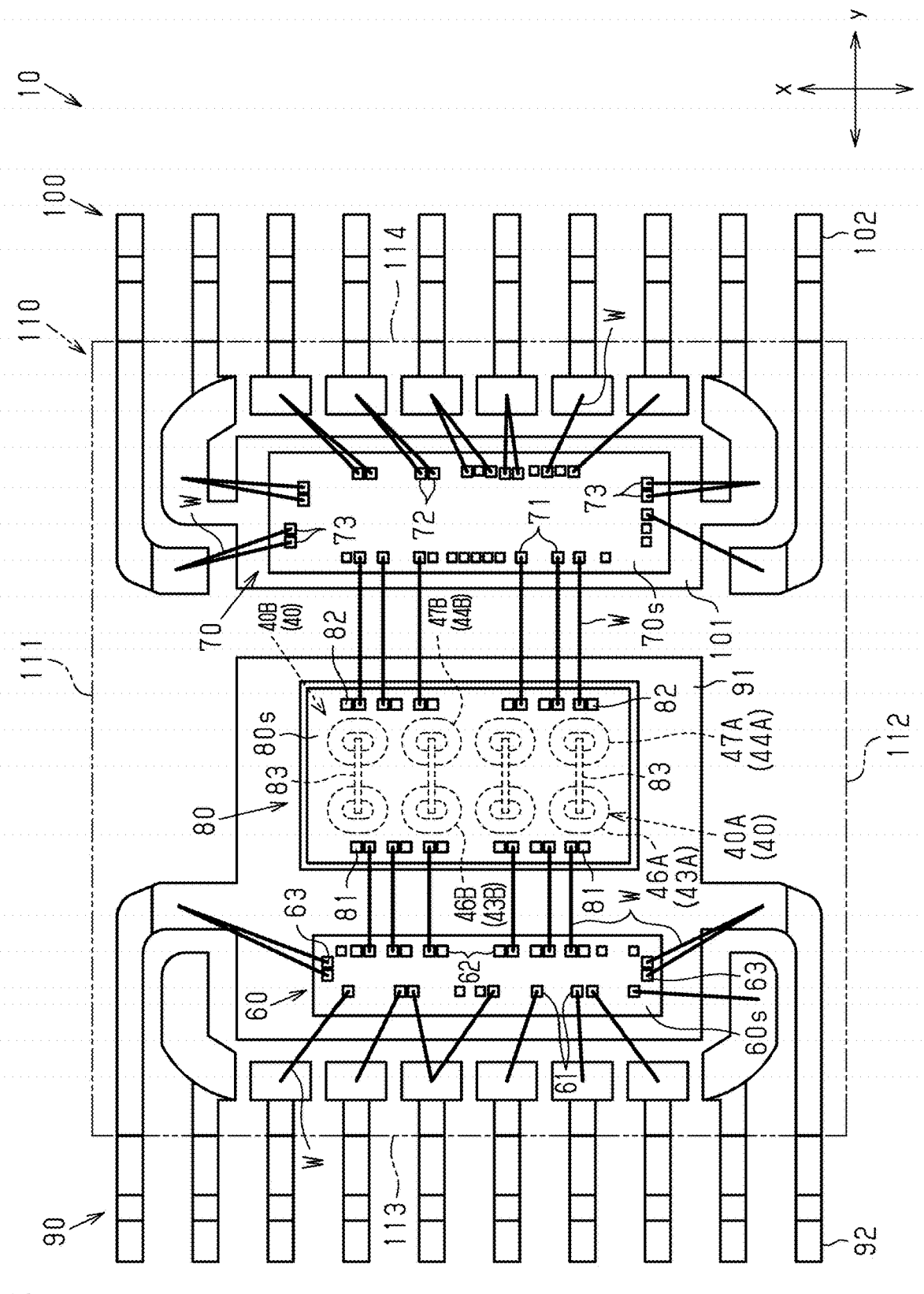
FIG. 12 is a plan view showing the internal structure of the gate driver of the third embodiment.
Figure 13:
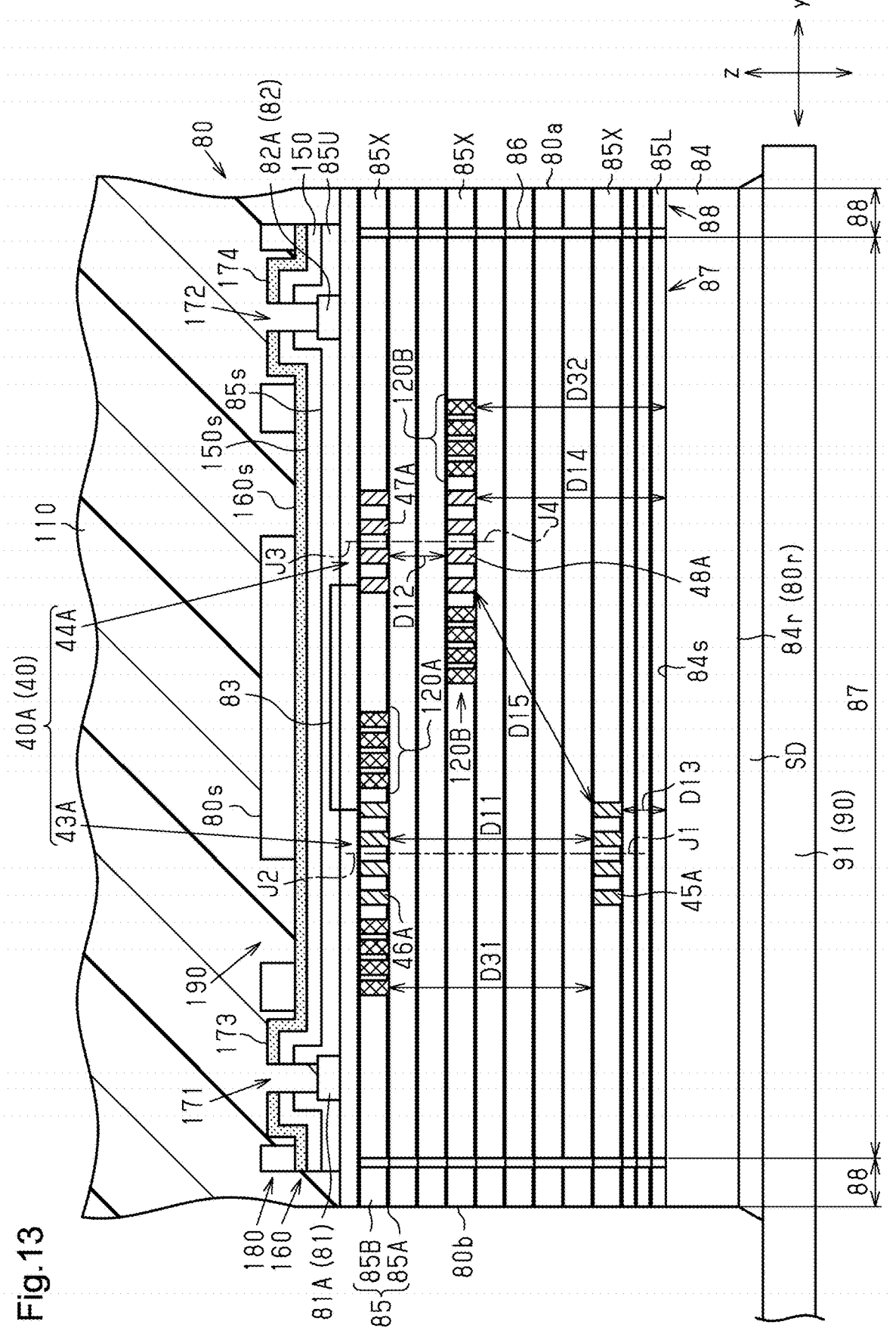
FIG. 13 is a cross-sectional view schematically showing the transformer chip mounted on the low-voltage die pad in the gate driver of the third embodiment.

FIG. 12 shows an example of a plan view showing the internal structure of the gate driver 10. FIG. 11 shows a simplified circuit configuration of the gate driver 10. Hence, the number of external terminals of the gate driver 10 shown in FIG. 12 is greater than the number of external terminals of the gate driver 10 shown in FIG. 11. The number of external terminals of the gate driver 10 is the number of external electrodes configured to connect the gate driver 10 to electronic components arranged outside the gate driver 10, such as the ECU 503 or the switching element 501 (refer to FIG. 11). The number of signal lines (the number of wires W described later) that transmit a signal from the low-voltage circuit 20 to the high-voltage circuit 30 in the gate driver 10 shown in FIG. 12 is greater than the number of signal lines in the gate driver 10 shown in FIG. 11.

As shown in FIG. 12, the transformer chip 80 includes the first transformers 43A and 43B and the second transformers 44A and 44B. More specifically, the transformers 43A, 44A, 43B, and 44B are arranged into a single package. In the transformer chip 80, the first transformer 43A and the second transformer 44A are aligned with each other in the x-direction and spaced apart from each other in the y-direction. The first transformer 43B and the second transformer 44B are aligned with each other in the x-direction and spaced apart from each other in the y-direction. The first transformer 43A and the first transformer 43B are aligned with each other in the y-direction and spaced apart from each other in the x-direction. In other words, the first transformer 43A and the second transformer 44A are spaced apart from each other in a direction in which the chips 60, 70, and 80 are arranged. The second transformer 44A and the second transformer 44B are aligned with each other in the y-direction and spaced apart from each other in the x-direction. In other words, the first transformer 43B and the second transformer 44B are spaced apart from each other in the direction in which the chips 60, 70, and 80 are arranged.

The first transformers 43A and 43B are disposed on the transformer chip 80 closer to the low-voltage circuit chip 60 than the second transformers 44A and 44B are. The first transformers 43A and 43B, which are electrically connected to the low-voltage circuit chip 60, are located close to the low-voltage circuit chip 60. This shortens the conductive paths between the low-voltage circuit 20 and the first transformers 43A and 43B.

The second transformers 44A and 44B are disposed on the transformer chip 80 closer to the high-voltage circuit chip 70 than the first transformers 43A and 43B are. The second transformers 44A and 44B, which are electrically connected to the high-voltage circuit chip 70, are located close to the high-voltage circuit chip 70. This shortens the conductive paths between the high-voltage circuit 30 and the second transformers 44A and 44B.

As shown in FIG. 12, the low-voltage circuit chip 60, the transformer chip 80, and the high-voltage circuit chip 70 are arranged and connected by wires W in the same manner as the first embodiment. The arrangement of the low-voltage circuit chip 60, the transformer chip 80, and the high-voltage circuit chip 70 on the low-voltage die pad 91 and the high-voltage die pad 101 is the same manner as that of the first embodiment.

An example of the internal structure of the transformer chip 80 will now be described with reference to FIG. 13. FIG. 13 shows a schematic cross-sectional structure of the transformer 40A in the transformer chip 80. The structure of the transformer 40B is the same as that of the transformer 40A and thus will not be described in detail. In the following description, a direction from the chip back surface 80r of the transformer chip 80 toward the chip main surface 80s is referred to as an upward direction, and a direction from the chip main surface 80s toward the chip back surface 80r is referred to as a downward direction.

As shown in FIG. 13, the first transformer 43A and the second transformer 44A are embedded in the insulation layers 85. In other words, the first transformer 43A and the second transformer 44A are spaced apart from each other in a direction in which the chips 60, 70, and 80 are arranged. The first transformer 43A and the second transformer 44A are disposed in the inner region 87 of the insulation layers 85.

The first coil 45A and the second coil 46A of the first transformer 43A are opposed to each other in the z-direction with the insulation layers 85 interposed. In the present embodiment, the first coil 45A and the second coil 46A are opposed to each other in the z-direction with the insulation layers 85 interposed. In the same manner as the first embodiment, each of the coils 45A and 46A is formed of a conductive layer embedded in one of the insulation layers 85.

In the z-direction, the second coil 46A is located farther away from the substrate 84 than the first coil 45A is. In other words, the second coil 46A is located above the first coil 45A. In other words, the first coil 45A is located closer to the substrate 84 in the z-direction than the second coil 46A is.

The first coil 47A and the second coil 48A of the second transformer 44A are opposed to each other in the z-direction with the insulation layers 85 interposed. In the same manner as the coils 45A and 46A, each of the coils 47A and 48A is formed of a conductive layer embedded in one of the insulation layers 85. In the z-direction, the first coil 47A is located farther away from the substrate 84 than the second coil 48A is. In other words, the first coil 47A is located above the second coil 48A. In other words, the second coil 48A is located closer to the substrate 84 in the z-direction than the first coil 47A is.

The positions of the first coils 45A and 47A and the second coils 46A and 48A in the transformer chip 80 are set so that the insulation voltage of the transformer chip 80 equals a predetermined insulation voltage.

A distance D11 between the first coil 45A and the second coil 46A is greater than a distance D12 between the first coil 47A and the second coil 48A. This limits occurrence of dielectric breakdown caused by a short-circuit of the first coil 45A and the second coil 46A. In an example, the distance D11 is greater than or equal to twice the distance D12. However, alternatively, the distance D11 may be less than twice the distance D12.

In the present embodiment, the second coil 46A and the first coil 47A are aligned with each other in the z-direction. The second coil 48A is located farther away (i.e., upward) from the substrate 84 than the first coil 45A is the z-direction. Thus, the distance D11 is greater than the distance D12.

In this case, as viewed in the y-direction, the second coil 48A is located between the first coil 45A and the second coil 46A in the z-direction. More specifically, a distance D14 between the second coil 48A and the substrate 84 is greater than a distance D13 between the first coil 45A and the substrate 84. This increases the distance D14 between the substrate 84 and the second coil 48A, to which a high voltage is likely to be applied, and improves the dielectric strength of the transformer chip 80. In an example, the distance D14 is greater than or equal to twice the distance D13. However, alternatively, the distance D14 may be less than twice the distance D13.

The second coil 48A is electrically connected to the high-voltage die pad 101 (refer to FIG. 12). The second end of the second coil 48A may differ in potential from the substrate 84. Therefore, the second coil 48A needs to be insulated from the substrate 84. The increased distance D14 between the second coil 48A and the substrate 84 improves the dielectric strength of the transformer chip 80.

In an example, the distance D14 between the second coil 48A and the substrate 84 is greater than or equal to the distance D12 between the first coil 47A and the second coil 48A. Thus, while limiting an increase in the size of the transformer chip 80 in the z-direction, the distance D14 is increased. This improves the dielectric strength of the transformer chip 80. The voltage applied between the first coil 45A and the second coil 46A is likely to be lower than the voltage applied between the second coil 48A and the substrate 84. Therefore, even when the distance D12 is decreased, the dielectric strength of the transformer chip 80 is ensured.

In the present embodiment, the distance D14 is greater than the distance D12. In an example, the distance D14 is greater than or equal to twice the distance D12. However, alternatively, the distance D14 may be less than twice the distance D12.

In an example, the distance D14 between the second coil 48A and the substrate 84 is greater than or equal to the distance D11 between the first coil 45A and the second coil 46A. This increases the distance D14 between the substrate 84 and the second coil 48A, to which a high voltage is likely to be applied, and improves the dielectric strength of the transformer chip 80. In the present embodiment, the distance D14 is equal to the distance D11.

The relationship of the distances D11 to D14 described above shows that the first coil 45A is located closer to the substrate 84 than the second coil 48A. Since the first coil 45A and the substrate 84 are electrically connected to the low-voltage die pad 91, the ground of the first coil 45A has the same potential as the substrate 84. Therefore, even when the first coil 45A is located close to the substrate 84, the dielectric strength of the transformer chip 80 will not be decreased. In the present embodiment, the distance D13 between the first coil 45A and the substrate 84 is less than the distance D11 between the first coil 45A and the second coil 46A. The distance D13 is less than or equal to one-half the distance D11. However, alternatively, the distance D13 may be greater than one-half of the distance D11.

In an example, a distance D15 between the second coil 48A and the first coil 45A is greater than or equal to the distance D14 between the second coil 48A and the substrate 84. The distance D15 is the shortest distance between the second coil 48A and the first coil 45A. This limits occurrence of dielectric breakdown caused by a short-circuit of the first coil 45A and the second coil 48A. Thus, the dielectric strength of the transformer chip 80 is improved.

In the present embodiment, the distance D15 is equal to the distance D14. The distance D15 is greater than or equal to the distance D11. In the present embodiment, the distance D14 is equal to the distance D11. Therefore, the distance D15 is equal to the distance D11.

The distance between the second coil 48A and the first coil 47A in the y-direction is set in accordance with the distance D15 between the second coil 48A and the first coil 45A. More specifically, an axis J1 of the first coil 45A coincides with an axis J2 of the second coil 46A. An axis J3 of the first coil 47A coincides with an axis J4 of the second coil 48A. Thus, the positions of the first coil 45A and the second coil 48A in the x-direction and the y-direction are set in accordance with the setting of the distance D15. In plan view, the positions of the second coil 46A and the first coil 47A in the x-direction and the y-direction are the same as the positions of the first coil 45A and the second coil 48A in the x-direction and the y-direction. This sets the distance between the second coil 48A and the first coil 47A in the y-direction.

Dummy patterns may be arranged around the second coils 46A and 46B of the first transformer 43A and the second coils 48A and 48B of the second transformer 44A. This limits concentration of an electric field on the second coils 46A, 46B, 48A, and 48B. In the description hereafter, a dummy pattern arranged around the second coils 46A and 46B is referred to as a dummy pattern 120A. A dummy pattern arranged around the second coils 48A and 48B is referred to as a dummy pattern 120B. The dummy patterns 120A and 120B have the same structure as the dummy pattern 120 of the first embodiment. The relationship between the second coils 46B and 48B and the dummy patterns 120A and 120B is the same as the relationship between the second coils 46A and 48A and the dummy patterns 120A and 120B. The relationship between the second coils 46A and 48A and the dummy patterns 120A and 120B will be described below, while the relationship between the second coils 46B and 48B and the dummy patterns 120A and 120B will not be described.

The dummy pattern 120A is aligned with the second coil 46A in the z-direction. The dummy pattern 120B is aligned with the second coil 48A in the z-direction. Therefore, a distance D31 between the dummy pattern 120A and the first coil 45A in the z-direction is greater than the distance D12 between the first coil 45A and the second coil 46A. A distance D32 between the dummy pattern 120B and the substrate 84 in the z-direction is greater than or equal to the distance D12 between the first coil 47A and the second coil 48A in the z-direction. In the present embodiment, the distance D32 is greater than the distance D12.

Since the second coil 48A is located closer to the substrate 84 than the second coil 46A is, the dummy pattern 120B is located closer to the substrate 84 than the dummy pattern 120A is. Also, since the second coil 48A is located farther away from the substrate 84 than the first coil 45A is, the dummy pattern 120B is located farther away from the substrate 84 than the first coil 45A is in the z-direction. In other words, the dummy pattern 120B is located between the first coil 45A and the second coil 46A in the z-direction.

The distance D15 between the first coil 45A and the second coil 48A is greater than or equal to the distance D32 between the dummy pattern 120B and the substrate 84 in the z-direction. In the present embodiment, the distance D15 is equal to the distance D32. The distance D15 may be greater than or equal to the distance D31 between the dummy pattern 120A and the first coil 45A in the z-direction.

In the present embodiment, the dummy pattern 120B is arranged around one (the second coil 48A) of the first coil 47A and the second coil 48A located farther away from the passivation layer 150 (the chip main surface 80s). The dummy pattern 120B is not limited to such a position. In an example, the dummy pattern 120B may be arranged around the first coil 47A. The dummy pattern 120B may be arranged around one (the first coil 47A) of the first coil 47A and the second coil 48A located closer to the passivation layer 150 (the chip main surface 80s).

The first electrode pads 81, the second electrode pads 82, and interconnects 83 are arranged on the insulation layer 85 that is located directly below the uppermost insulation layer 85U among the insulation layers 85. Each interconnect 83 connects the first transformer 43A (43B) and the second transformer 44A (44B) and is formed from, for example, Al or Cu. The interconnect 83 is, for example, covered by the uppermost insulation layer 85U. The first electrode pads 81 and the second transformer 44A are located at opposite sides of the first transformer 43A in the y-direction. The second electrode pads 82 and the first transformer 43A are located at opposite sides of the second transformer 44A in the y-direction.

The interconnects 83 include a first interconnect connecting the second coil 46A of the first transformer 43A and the first coil 47A of the second transformer 44A and a second interconnect connecting the second coil 46B of the first transformer 43B and the first coil 47B of the second transformer 44B. This shortens each of the distance between the second coil 46A and the first coil 47A and the distance between the second coil 46B and the first coil 47B as compared to a structure in which, for example, the second coil 46A and the first coil 47A are connected by a wire W and the second coil 46B and the first coil 47B are connected by a wire W.

In the same manner as the first embodiment, the passivation layer 150, the low dielectric layer 160, and the resin layer 180 are stacked on the uppermost insulation layer 85U in this order.

The passivation layer 150 entirely covers the transformers 40A and 40B and the dummy patterns 120A and 120B in plan view. In the same manner as the first embodiment, the low dielectric layer 160 entirely covers the passivation layer 150 in plan view. The low dielectric layer 160 entirely covers the transformers 40A and 40B, the dummy patterns 120A and 120B, and the interconnects 83 in plan view.

Advantage of Third Embodiment

The gate driver 10 of the present embodiment obtains the following advantages in addition to the advantages of the first embodiment.

(3-1) The transformer 40A includes the first transformer 43A and the second transformer 44A connected in series. The transformer 40B includes the first transformer 43B and the second transformer 44B connected in series. With this structure, the first transformer 43A and the second transformer 44A form a double insulation structure between the low-voltage circuit 20 and the high-voltage circuit 30 in the signal line that transmits the set signal. The first transformer 43B and the second transformer 44B form a double insulation structure between the low-voltage circuit 20 and the high-voltage circuit 30 in the signal line that transmits the reset signal. This improves the insulation voltage of the gate driver 10.

Fourth Embodiment

A third embodiment of a gate driver 10 will be described with reference to FIGS. 14 and 15. The gate driver 10 of the present embodiment differs from the gate driver 10 of the first embodiment in that the insulation structure is formed by a capacitor 50 instead of the transformer 40. In the following description, the differences from the gate driver 10 of the first embodiment will be described in detail. The same reference characters are given to those components that are the same as the corresponding components of the gate driver 10 of the first embodiment. Such components will not be described in detail.

Figure 14:
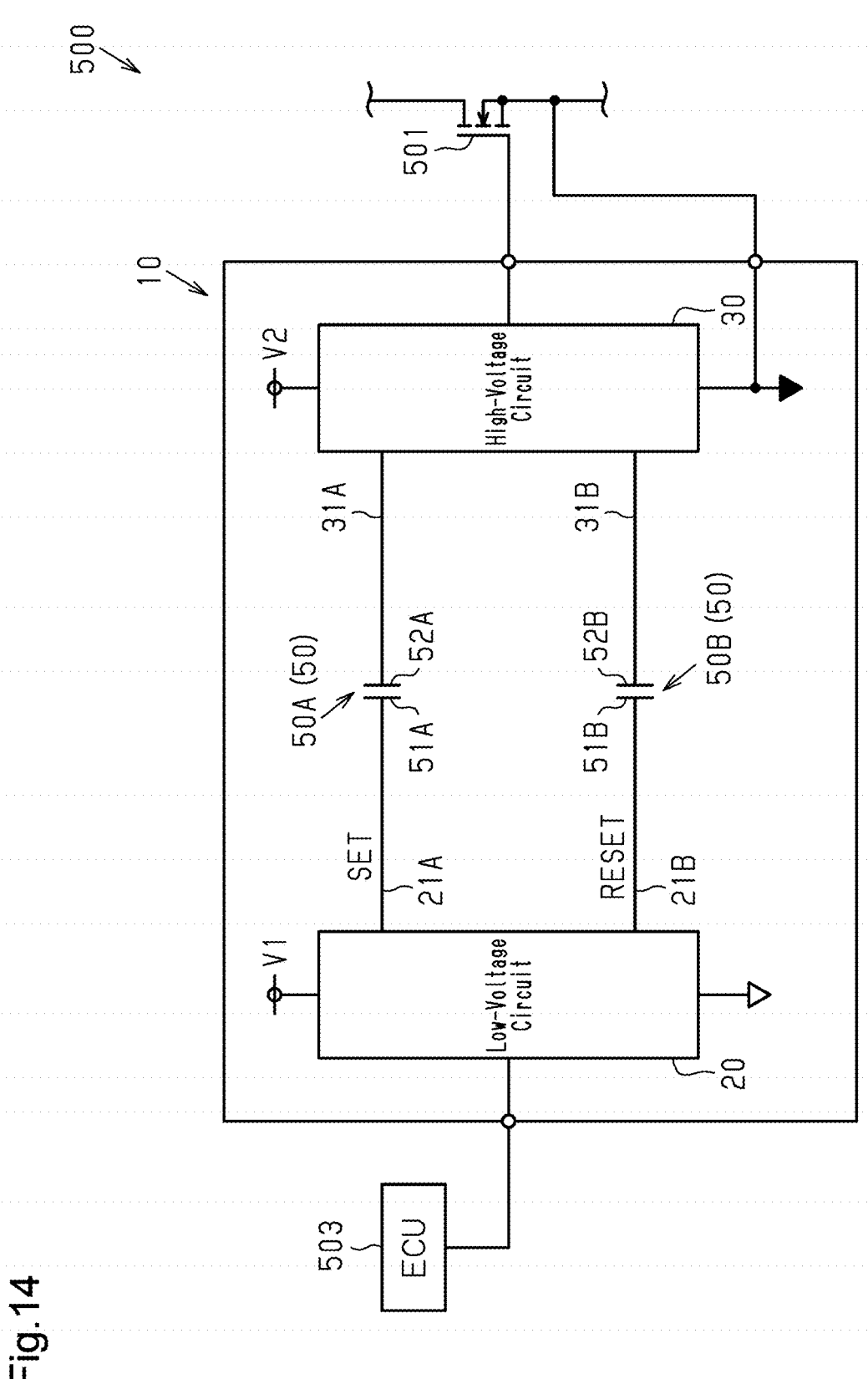
FIG. 14 is a schematic circuit diagram showing a fourth embodiment of a gate driver.

As shown in FIG. 14, a capacitor 50 includes a capacitor 50A connected to a signal line transmitting a set signal and a capacitor 50B connected to a signal line transmitting a reset signal. The capacitors 50A and 50B form an insulation structure that electrically insulates the low-voltage circuit 20 from the high-voltage circuit 30. The capacitors 50A and 50B are disposed between the low-voltage circuit 20 and the high-voltage circuit 30.

The capacitor 50A includes a first electrode plate 51A and a second electrode plate 52A. The capacitor 50B includes a first electrode plate 51B and a second electrode plate 52B. The first electrode plate 51A of the capacitor 50A is connected to the low-voltage circuit 20 by the low-voltage signal line 21A. The second electrode plate 52A of the capacitor 50A is connected to the high-voltage circuit 30 by the high-voltage signal line 31A. The first electrode plate 51B of the capacitor 50B is connected to the low-voltage circuit 20 by the low-voltage signal line 21B. The second electrode plate 52B of the capacitor 50B is connected to the high-voltage circuit 30 by the high-voltage signal line 31B. Thus, the low-voltage circuit 20 and the high-voltage circuit 30 transmit a set signal through the capacitor 50A and a reset signal through the capacitor 50B.

In the present embodiment, the gate driver 10 includes the low-voltage circuit chip 60, a capacitor chip 200 (refer to FIG. 15), and the high-voltage circuit chip 70 (refer to FIG. 2). Although not shown, the low-voltage circuit chip 60 and the capacitor chip 200 are mounted on the low-voltage die pad 91 (refer to FIG. 15) of the low-voltage lead frame 90. The high-voltage circuit chip 70 is mounted on the high-voltage die pad 101 (refer to FIG. 2) of the high-voltage lead frame 100. The low-voltage circuit chip 60, the capacitor chip 200, and the high-voltage circuit chip 70 are arranged in the same manner as the low-voltage circuit chip 60, transformer chip 80, and the high-voltage circuit chip 70 of the first embodiment. That is, in the present embodiment, the transformer chip 80 of the first embodiment is replaced with the capacitor chip 200.

Figure 15:
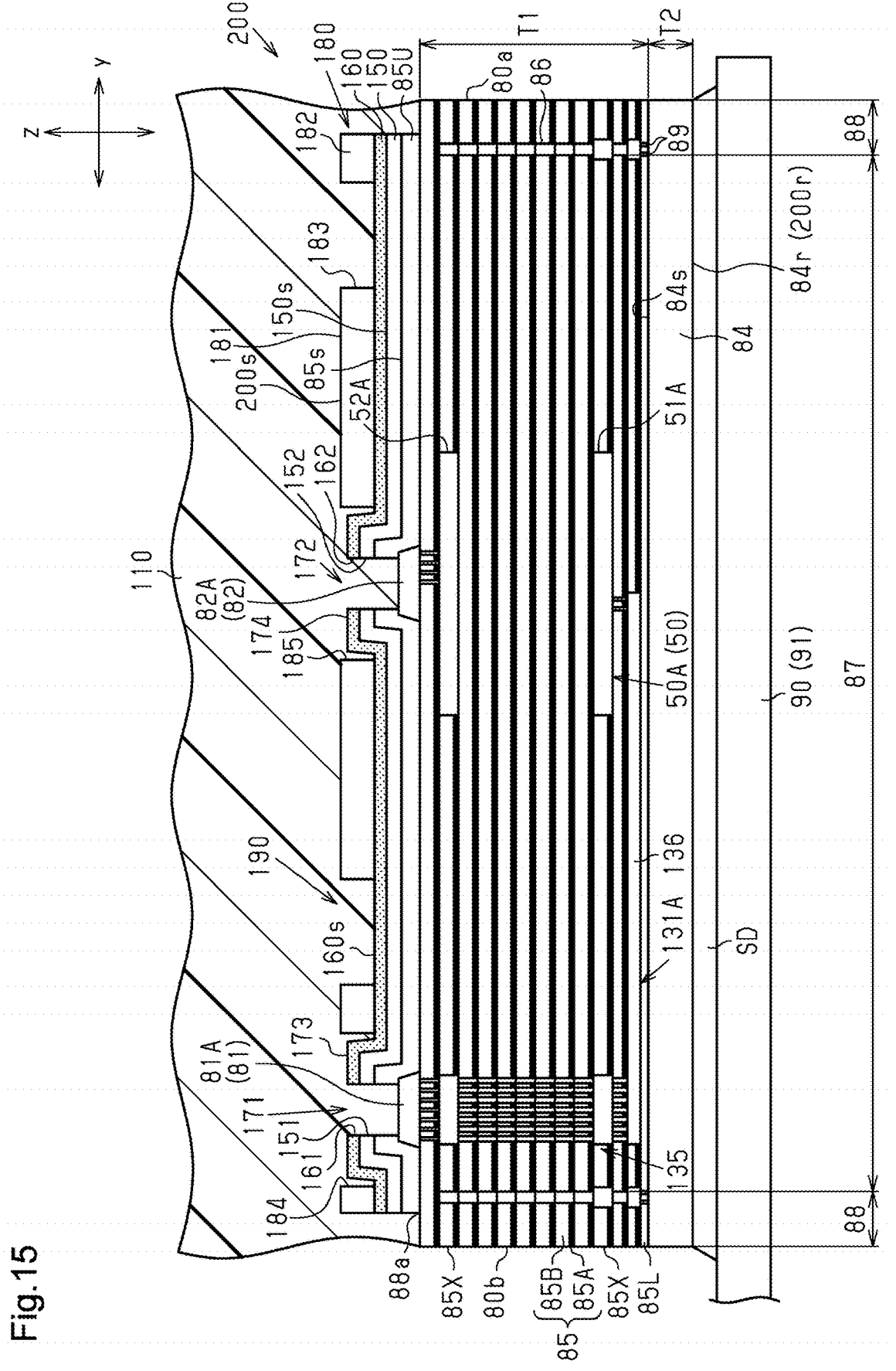
FIG. 15 is a cross-sectional view showing the transformer chip mounted on the low-voltage die pad in the gate driver of the fourth embodiment.

As shown in FIG. 15, the capacitor chip 200 includes a chip main surface 200s and a chip back surface 200r facing in opposite directions in the z-direction. The chip back surface 200r of the capacitor chip 200 is bonded to the low-voltage die pad 91 by a conductive bonding material SD.

The first electrode pads 81 and the second electrode pads 82 are formed on the chip main surface 200s of the capacitor chip 200. Although not shown, the first electrode pads 81 are disposed on one of the opposite ends of the chip main surface 200s in the y-direction located closer to the low-voltage circuit chip 60. The first electrode pads 81 are arranged in the x-direction. The second electrode pads 82 are disposed on one of the opposite ends of the chip main surface 200s in the y-direction located closer to the high-voltage circuit chip 70. The second electrode pads 82 are arranged in the x-direction. In plan view, the capacitors and 50B are arranged between the first electrode pads 81 and the second electrode pads 82 in the y-direction. The capacitors 50A and 50B are aligned with each other in the y-direction and spaced apart from each other in the x-direction.

An example of the internal structure of the capacitor chip 200 will now be described with reference to FIG. 15. FIG. 15 shows a schematic cross-sectional structure of the capacitor 50A. The structure of the capacitor 50B is the same as that of the capacitor 50A and thus will not be described in detail. In the following description, a direction from the chip back surface 200r of the capacitor chip 200 toward the chip main surface 200s is referred to as an upward direction, and a direction from the chip main surface 200s toward the chip back surface 200r is referred to as a downward direction. In the capacitor chip 200, the same reference characters are given to those components that are the same as the corresponding components of the transformer chip 80. Such components will not be described in detail.

As shown in FIG. 15, the first electrode plate 51A and the second electrode plate 52A of the capacitor 50A are opposed to each other in the z-direction with the insulation layers 85 interposed. Each of the first electrode plates 51A and 52A is formed as a conductive layer embedded in one of the insulation layers 85. More specifically, an opening extends in the z-direction through the first insulation layer 85A and the second insulation layer 85B of the insulation layer 85 in which one of the first electrode plates 51A and 52A is embedded. The conductive layers are embedded in the openings of the insulation layers 85 to form the first electrode plates 51A and 52A.

In the z-direction, the second electrode plate 52A is located farther away from the substrate 84 than the first electrode plate 51A is. In other words, the second electrode plate 52A is located above the first electrode plate 51A. The first electrode plate 51A is connected to the first electrode pad 81 by the first interconnect 131A. The second electrode plate 52A is connected to the second electrode pad 82 by the third interconnect 133A.

In the same manner as the first embodiment, the passivation layer 150, the low dielectric layer 160, and the resin layer 180 are stacked on the uppermost insulation layer 85U in this order. The shapes of the passivation layer 150, the low dielectric layer 160, and the resin layer 180 are the same as those of the first embodiment. The present embodiment has the same advantages as the first embodiment.

Modified Examples

The above embodiments exemplify, without any intention to limit, applicable forms of an insulation module and a gate driver according to the present disclosure. The insulation module and the gate driver according to the present disclosure can be applicable to forms differing from the above embodiments. In an example of such a form, the structure of the embodiments is partially replaced, changed, or omitted, or a further structure is added to the embodiments. The modified examples described below may be combined with one another as long as there is no technical inconsistency. In the modified examples, the same reference characters are given to those components that are the same as the corresponding components of the above embodiments. Such components will not be described in detail.

In each embodiment, another insulation layer or a low dielectric layer may be disposed between the passivation layer 150 and the low dielectric layer 160. That is, the low dielectric layer 160 may be configured to not contact the passivation layer 150.

In the first to third embodiments, the resin layer 180 may be omitted from the transformer chip 80. As a result, the irregular structure 190 is omitted from the transformer chip 80. Also, in the fourth embodiment, the resin layer 180 may be omitted from the capacitor chip 200.

In each embodiment, the passivation layer 150 is not limited to a material including silicon nitride and may be any layer that protects the insulation layers 85. However, the passivation layer 150 is formed from a material having a higher permittivity than the low dielectric layer 160.

In each embodiment, the permittivity of the low dielectric layer 160 may be greater than the permittivity of the mold resin 110 within a range that is less than the permittivity of the passivation layer 150.

In the first and second embodiments, the arrangement of the transformers 40AA, 40AB, 40BA, and 40BB may be changed in any manner. In an example, the transformer 40AA, the transformer 40BA, the transformer 40AB, and the transformer 40BB may be arranged in this order from the chip side surface 80c of the transformer chip 80 toward the chip side surface 80d.

In the first and second embodiments, the first dummy pattern 121 of the dummy pattern 120 is electrically connected to the second coil 42B. However, there is no limit to such a configuration. In an example, the first dummy pattern 121 may be arranged independently of the second coils 42A and 42B. In other words, the first dummy pattern 121 may be configured to not be electrically connected to the second coils 42A and 42B. In the first and second embodiments, the third dummy pattern 123 is electrically connected to the first dummy pattern 121. However, there is no limit to such a configuration. In an example, the third dummy pattern 123 may be configured to not be electrically connected to the first dummy pattern 121. In a first transformer chip 80A, a voltage applied to the dummy patterns 121 to 123 may be greater than a voltage applied to the first coils 41A and 41B. The dummy patterns 120A and 120B of the third embodiment may be changed in the same manner as the dummy pattern 120.

In the first to third embodiments, the structure of the dummy patterns 120, 120A, and 120B may be changed in any manner. In an example, one or two of the first dummy pattern 121, the second dummy pattern 122, and the third dummy pattern 123 may be omitted from the dummy patterns 120, 120A, and 120B. The dummy patterns 120, 120A, and 120B may be omitted from the transformer chip 80.

In the second embodiment, the first inner cover 165 of the low dielectric layer 160 may be separated from the first electrode pads 81 in the z-direction. The second inner cover 166 of the low dielectric layer 160 may be separated from the second electrode pads 82 in the z-direction.

In the second embodiment, it is sufficient that the first inner cover 165 of the low dielectric layer 160 is disposed on at least the first inner surface of the passivation layer 150 defining the first protection layer opening 151. The first inner cover 165 of the low dielectric layer 160 does not necessarily have to be disposed on the first inner surface of the uppermost insulation layer 85U defining the first insulation layer opening 85Ua. Also, it is sufficient that the second inner cover 166 of the low dielectric layer 160 is disposed on at least the second inner surface of the passivation layer 150 defining the second protection layer opening 152. The second inner cover 166 of the low dielectric layer 160 does not necessarily have to be disposed on, for example, the second inner surface of the uppermost insulation layer 85U defining the second insulation layer opening 85Ub.

In the second embodiment, one or two of the first inner cover 165, the second inner cover 166, and the outer side cover 167 may be omitted from the low dielectric layer 160.

Figure 16:
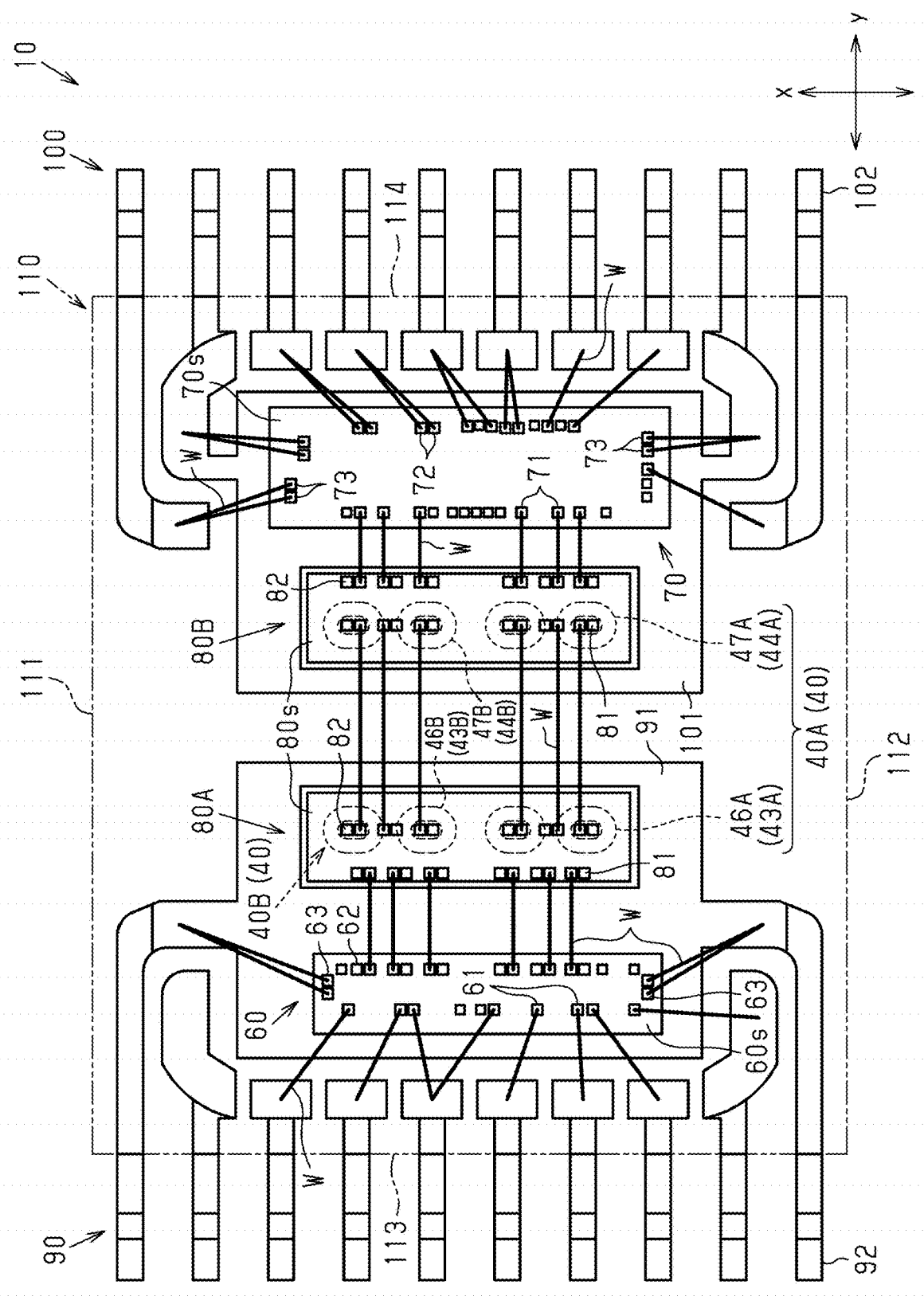
FIG. 16 is a plan view showing the internal structure of a modified example of a gate driver.

In the third embodiment, the gate driver 10 may include the first transformer chip 80A and the second transformer chip 80B instead of the transformer chip 80. More specifically, as shown in FIG. 16, the gate driver 10 includes the low-voltage circuit chip 60, the high-voltage circuit chip 70, a first transformer chip 80A, and a second transformer chip 80B. The low-voltage circuit chip 60, the high-voltage circuit chip 70, the first transformer chip 80A, and the second transformer chip 80B are spaced apart from each other in the y-direction. In other words, the chips 60, 70, 80A, and 80B are arranged in the arrangement direction of the low-voltage die pad 91 and the high-voltage die pad 101.

In the example shown, the low-voltage circuit chip 60, the first transformer chip 80A, the second transformer chip 80B, and the high-voltage circuit chip 70 are arranged in this order from the low-voltage leads 92 toward the high-voltage leads 102 in the y-direction. In other words, in plan view, the transformer chips 80A and 80B are disposed between the low-voltage circuit chip 60 and the high-voltage circuit chip 70.

In the example shown, the low-voltage circuit chip 60 and the first transformer chip 80A, are mounted on the low-voltage die pad 91 of the low-voltage lead frame 90. The high-voltage circuit chip 70 and the second transformer chip 80B are mounted on the high-voltage die pad 101 of the high-voltage lead frame 100.

The first transformer chip 80A includes the first transformer 43A of the transformer 40A and the first transformer 43B of the transformer 40B. More specifically, the transformers 43A and 43B are arranged into a single package. Thus, the first transformer chip 80A includes transformers of the transformers 40A and 40B that are located closer to the low-voltage circuit 20 than to the high-voltage circuit 30 in the circuitry.

The second transformer chip 80B includes the second transformer 44A of the transformer 40A and the second transformer 44B of the transformer 40B. More specifically, the transformers 44A and 44B are arranged into a single package. Thus, the second transformer chip 80B includes transformers of the transformers 40A and 40B that are located closer to the high-voltage circuit 30 than to the low-voltage circuit 20 in the circuitry.

In the example shown, the first transformer chip 80A has the same structure as the transformer chip 80 of the first embodiment. The second transformer chip 80B differs from the transformer chip 80 of the first embodiment in the arrangement of the coils 47A, 47B, 48A, 48B and arrangement of the coils 47A, 47B, 48A, 48B with respect to the electrode pads 81 and 82.

More specifically, the first electrode pads 81 of the second transformer chip 80B are disposed near the center of the chip main surface 80s of the second transformer chip 80B in the y-direction. The second electrode pads 82 of the second transformer chip 80B are disposed on one of opposite ends of the chip main surface 80s of the second transformer chip 80B in the y-direction located closer to the high-voltage circuit chip 70.

Although not shown, in the second transformer chip 80B, the first coils 47A and 47B are disposed farther away from the substrate 84 than the second coils 48A and 48B are. In other words, the second coils 48A and 48B are disposed closer to the substrate 84 than the first coils 47A and 47B are. The first coils 47A and 47B are separately electrically connected to the first electrode pads 81 of the second transformer chip 80B. The second coils 48A and 48B are separately electrically connected to the second electrode pads 82 of the second transformer chip 80B.

The low-voltage circuit chip 60 and the first transformer chip 80A are connected by wires W. More specifically, the second electrode pads 62 of the low-voltage circuit chip 60 and the first electrode pads 81 of the first transformer chip 80A are connected by the wires W. Thus, the low-voltage circuit 20 is potentially connected to the first coil 45A (refer to FIG. 11) of the first transformer 43A, and the low-voltage circuit 20 is electrically connected to the first coil 45B (refer to FIG. 11) of the first transformer 43B.

The first transformer chip 80A and the second transformer chip 80B are connected by wires W. More specifically, the second electrode pads 82 of the first transformer chip 80A and the first electrode pads 81 of the second transformer chip 80B are connected by the wires W. Thus, the second coil 46A of the first transformer 43A is electrically connected to the first coil 47A of the second transformer 44A, and the second coil 46B of the first transformer 43B is electrically connected to the first coil 47B of the second transformer 44B.

The second transformer chip 80B and the high-voltage circuit chip 70 are connected by wires W. More specifically, the second electrode pads 82 of the second transformer chip 80B and the first electrode pads 71 of the high-voltage circuit chip 70 are connected by the wires W. Thus, the second coil 48A (refer to FIG. 11) of the second transformer 44A is electrically connected to the high-voltage circuit 30, and the second coil 48B (refer to FIG. 11) of the second transformer 44B is electrically connected to the high-voltage circuit 30.

In the third and fourth embodiments, the shape of the low dielectric layer 160 may be changed in any manner. In an example, the low dielectric layer 160 may have the shape of the low dielectric layer 160 of the second embodiment.

In the first to third embodiments, the low-voltage circuit 20 and the transformer 40 are mounted on separate chips. However, there is no limit to such a configuration. The transformer 40 and the low-voltage circuit 20 may be mounted on a single chip. The chip is covered by the mold resin 110. Thus, the low dielectric layer 160, which is disposed on the chip, is covered by the mold resin 110. In an example, the low-voltage circuit 20 may be disposed on the substrate 84 of the transformer chip 80. The transformer chip 80 is covered by the mold resin 110. Also, in the fourth embodiment, the capacitor 50 and the low-voltage circuit 20 may be mounted on a single chip. That is, the insulation module and the low-voltage circuit 20 may be mounted on a single chip.

In the first to third embodiments, the high-voltage circuit 30 and the transformer 40 are mounted on separate chips. However, there is no limit to such a configuration. The transformer 40 and the high-voltage circuit 30 may be mounted on a single chip. The chip is covered by the mold resin 110. Thus, the low dielectric layer 160, which is disposed on the chip, is covered by the mold resin 110. In an example, the high-voltage circuit 30 may be disposed on the substrate 84 of the transformer chip 80. In this case, the transformer chip 80 is mounted on the high-voltage die pad 101. The transformer chip 80 is covered by the mold resin 110. Also, in the fourth embodiment, the capacitor 50 and the high-voltage circuit 30 may be mounted on a single chip. That is, the insulation module and the high-voltage circuit may be mounted on a single chip.

In the first to third embodiments, the gate driver 10 may include an insulation module in which the transformers 40 are accommodated in a single package. The insulation module includes the transformer chip 80 and the mold resin 110 encapsulating the transformer chip 80. The insulation module may further include a die pad on which the transformer chip 80 is mounted, leads, and wires connecting the leads to the transformer chip 80. The mold resin 110 encapsulates the transformer chip 80, the die pad, and the wires. The leads are configured to be electrically connected to both the low-voltage circuit 20 and the high-voltage circuit 30. Also, in the fourth embodiment, the gate driver 10 may include an insulation module in which the capacitors 50 are accommodated in a single package. More specifically, the insulation module includes an insulation chip and a mold resin encapsulating the insulation chip. The insulation module is used to insulate the low-voltage circuit 20 and the high-voltage circuit 30 included in the gate driver 10.

In the first to third embodiments, the gate driver 10 may include a low-voltage circuit unit in which the low-voltage circuit 20 and the transformer 40 are accommodated in a single package. The low-voltage circuit unit may include the low-voltage circuit chip 60, the transformer chip 80, and the mold resin 110 encapsulating the low-voltage circuit chip 60 and the transformer chip 80. The low-voltage circuit unit may further include a die pad, first leads, first wires connecting the first leads to the low-voltage circuit chip 60, second leads, and second wires connecting the second leads to the transformer chip 80. The mold resin 110 encapsulates at least the low-voltage circuit chip 60, the transformer chip 80, the die pad, and the wires. In an example, the first leads are configured to be electrically connected to the ECU 503, and the second leads are configured to be electrically connected to the high-voltage circuit 30. Also, in the fourth embodiment, the gate driver 10 may include a low-voltage circuit unit in which the low-voltage circuit 20 and the capacitor 50 are accommodated in a single package. That is, the low-voltage circuit unit may include the low-voltage circuit chip 60, an insulation module, and the mold resin 110 encapsulating the low-voltage circuit chip 60 and the insulation module.

In the first to third embodiments, the gate driver 10 may include a high-voltage circuit unit in which the high-voltage circuit 30 and the transformer 40 are accommodated in a single package. The high-voltage circuit unit may include the high-voltage circuit chip 70, the transformer chip 80, and the mold resin 110 encapsulating the high-voltage circuit chip 70 and the transformer chip 80. The high-voltage circuit unit may further include a die pad, first leads, first wires connecting the first leads to the high-voltage circuit chip 70, second leads, and second wires connecting the second leads to the transformer chip 80. The mold resin 110 encapsulates at least the high-voltage circuit chip 70, the transformer chip 80, the die pad, and the wires. In an example, the first leads are configured to be electrically connected to the source of the switching element 501, and the second leads are configured to be electrically connected to the low-voltage circuit 20. Also, in the fourth embodiment, the gate driver 10 may include a high-voltage circuit unit in which the high-voltage circuit 30 and the capacitor 50 are accommodated in a single package. That is, the high-voltage circuit unit may include the high-voltage circuit chip 70, an insulation module, and the mold resin 110 encapsulating the high-voltage circuit chip 70 and the insulation module.

Figure 17:
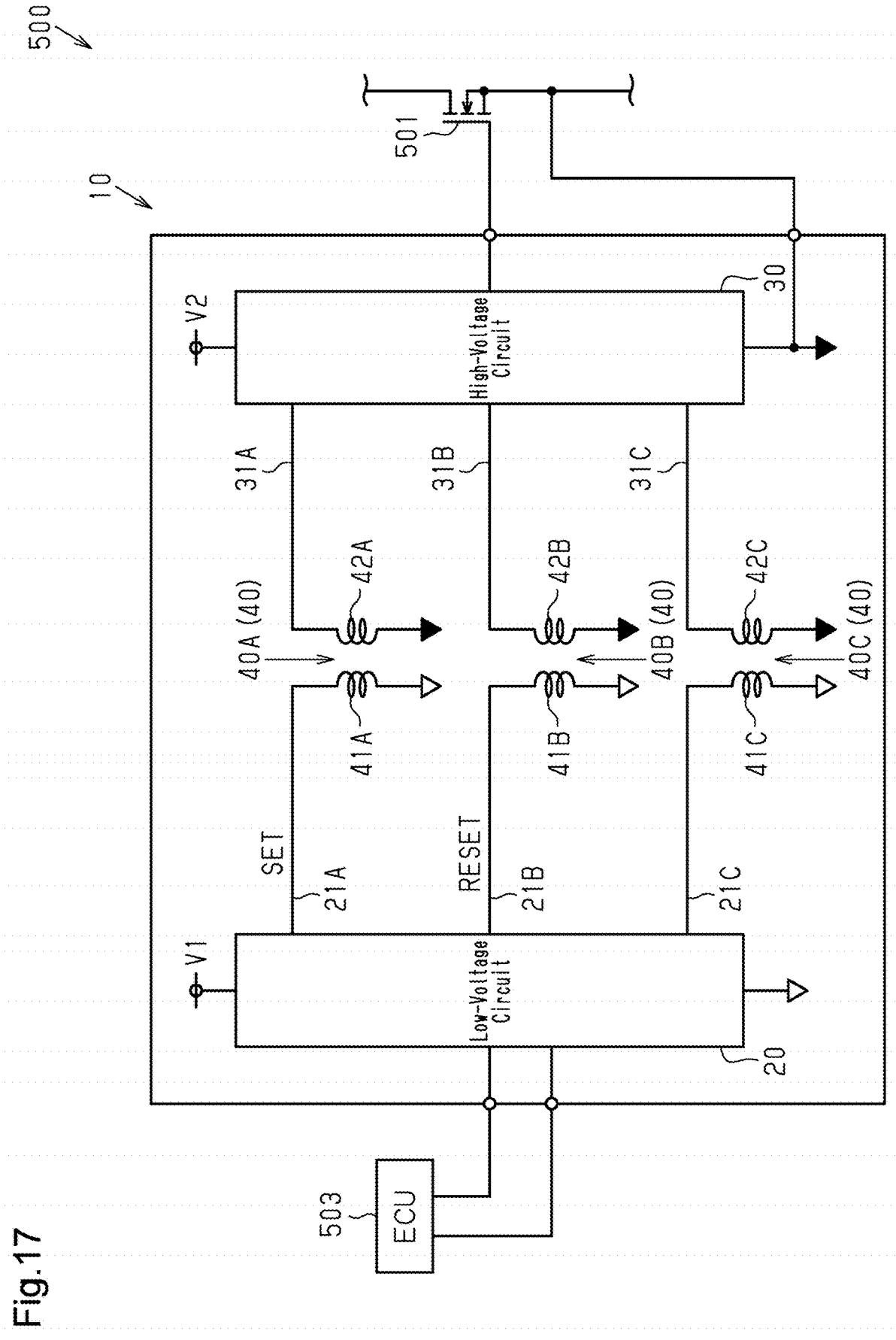
FIG. 17 is a schematic circuit diagram showing a modified example of a gate driver.

In each embodiment, the gate driver 10 may transmit a signal from the high-voltage circuit 30 to the low-voltage circuit 20 through the insulation module. As shown in FIG. 17, an example of a structure in which the gate driver 10 of the first embodiment further includes a signal path for transmitting a signal from the high-voltage circuit 30 to the low-voltage circuit 20 will be described.

As shown in FIG. 17, the gate driver 10 includes a transformer 40C configured to transmit a signal from the high-voltage circuit 30 to the low-voltage circuit 20. The transformer 40C insulates the high-voltage circuit 30 from the low-voltage circuit 20 while transmitting a signal from the high-voltage circuit 30 toward the low-voltage circuit 20. An example of the signal is an anomaly detection signal that is output when an anomaly of the switching element 501 is detected. Examples of the anomaly of the switching element 501 include an anomaly (temperature anomaly) such that the temperature of the switching element 501 excessively increases, an anomaly (overcurrent) such that an excessively large current flows to the switching element 501, and an anomaly (overvoltage) such that an excessively high voltage is applied to the switching element 501. That is, the gate driver 10 transmits an anomaly detection signal from the high-voltage circuit 30 to the low-voltage circuit 20 through the transformer 40C when a temperature anomaly, an overcurrent, an overvoltage of the switching elements 501 or the like is detected.

The transformer 40C has the same structure as the transformers 40A and 40B and includes a first coil 41C and a second coil 42C.

The first coil 41C is connected to a low-voltage signal line 21C connected to the low-voltage circuit 20. The first coil 41C is also connected to the ground of the low-voltage circuit 20. The second coil 42C is connected to a high-voltage signal line 31C connected to the high-voltage circuit 30. The second coil 42C is also connected to the ground of the high-voltage circuit 30. The signal output from the high-voltage circuit 30 is transmitted through the transformer 40C to the low-voltage circuit 20.

As described above, in the modified example shown in FIG. 17, signals are transmitted bidirectionally between the low-voltage circuit 20 and the high-voltage circuit 30. The signals include a first signal transmitted from the low-voltage circuit 20 toward the high-voltage circuit 30 and a second signal transmitted from the high-voltage circuit 30 toward the low-voltage circuit 20. The first signal is transmitted from the low-voltage circuit 20 to the high-voltage circuit 30 through the first coil 41A (41B) and then the second coil 42A (42B). The second signal is transmitted from the high-voltage circuit 30 to the low-voltage circuit 20 through the second coil 42C and then the first coil 41C.

In the present disclosure, the term "on" includes the meaning of "above" in addition to the meaning of "on" unless otherwise clearly indicated in the context. Thus, the phrase "A is formed on B" is intended to mean that A may be disposed directly on B in contact with B in the present embodiment and also that A may be disposed above B without contacting B in a modified example. In other words, the term "on" does not exclude a structure in which another member is formed between A and B.

The z-direction as referred to in the present disclosure does not necessarily have to be the vertical direction and does not necessarily have to fully conform to the vertical direction. In the structures according to the present disclosure, "upward" and "downward" in the z-direction as referred to in the present description are not limited to "upward" and "downward" in the vertical direction. In an example, the x-direction may conform to the vertical direction. In another example, the y-direction may conform to the vertical direction.

In this specification, "at least one of A and B" should be understood to mean "only A, only B, or both A and B."

CLAUSES

The technical aspects that are understood from the embodiments and the modified examples will be described below. The reference signs of the elements in the embodiments are given to the corresponding elements in clauses with parentheses. The reference signs used as examples to facilitate understanding, and the elements in each clause are not limited to those elements given with the reference signs.

[Clause 1] An insulation module, including:
  a first conductor (41A, 41B/51A, 51B) and a second conductor (42A, 42B/52A, 52B) embedded in an insulation layer (85) and spaced apart and opposed to each other in a thickness-wise direction (z-direction) of the insulation layer (85);
  a first electrode (81) connected to the first conductor (41A, 41B/51A, 51B);

a second electrode (82) spaced apart from the first electrode (81) as viewed in the thickness-wise direction (z-direction) of the insulation layer (85) and connected to the second conductor (42A, 42B/52A, 52B);

a passivation layer (150) disposed on a surface (85s) of the insulation layer (85);

a low dielectric layer (160) disposed on a surface (150s) of the passivation layer (150) and having a lower permittivity than the passivation layer (150); and a mold resin (110) covering the low dielectric layer (160).

[Clause 2] The insulation module according to clause 1, where the passivation layer (150) is formed from a material including silicon nitride.

[Clause 3] The insulation module according to clause 1 or 2, where the permittivity of the low dielectric layer (160) is less than or equal to a permittivity of the mold resin (110).

[Clause 4] The insulation module according to any one of clauses 1 to 3, where a thickness (TE) of the low dielectric layer (160) is less than or equal to a thickness (TP) of the passivation layer (150).

[Clause 5] The insulation module according to any one of clauses 1 to 4, where the passivation layer (150) and the low dielectric layer (160) include a first opening (171) extending through the passivation layer (150) and the low dielectric layer (160) at a position overlapping with the first electrode (81) as viewed in the thickness-wise direction (z-direction) of the insulation layer (85), the passivation layer (150) and the low dielectric layer (160) include a second opening (172) extending through the passivation layer (150) and the low dielectric layer (160) at a position overlapping with the second electrode (82) as viewed in the thickness-wise direction (z-direction) of the insulation layer (85), and the mold resin (110) is in contact with the first electrode (81) through the first opening (171) and in contact with the second electrode (82) through the second opening (172).

[Clause 6] The insulation module according to any one of clauses 1 to 4, where the passivation layer (150) includes a first inner surface defining a first opening (171) extending through the passivation layer (150) at a position overlapping with the first electrode (81) as viewed in the thickness-wise direction (z-direction) of the insulation layer (85), the passivation layer (150) includes a second inner surface defining a second opening (172) extending through the passivation layer (150) at a position overlapping with the second electrode (82) as viewed in the thickness-wise direction (z-direction) of the insulation layer (85), the low dielectric layer (160/165, 166) is disposed on the first inner surface and the second inner surface, and the low dielectric layer (160/167) covers an end surface of the passivation layer (150).

[Clause 7] The insulation module according to any one of clauses 1 to 6, where a resin layer (180) is arranged on a surface (160s) of the low dielectric layer (160) and includes a groove (183) that exposes the surface (160s) of the low dielectric layer (160), and a region of the surface (160s) of the low dielectric layer (160) between the first electrode (81) and the second electrode (82) includes an irregular structure (190) formed by an interface between the mold resin (110) and the resin layer (180) and an interface between the mold resin (110) and the low dielectric layer (160).

[Clause 8] The insulation module according to any one of clauses 1 to 7, where the first conductor includes a first coil (41A, 41B), the second conductor includes a second coil (42A, 42B), and the first coil (41A, 41B) and the second coil (42A, 42B) form a transformer (40/40A, 40B).

[Clause 9] The insulation module according to clause 9, where a dummy pattern (120) is arranged around one (42A, 42B) of the first coil (41A, 41B) and the second coil (42A, 42B) that is located closer to the passivation layer (150).

[Clause 10] The insulation module according to any one of clauses 1 to 7, where the first conductor includes a first electrode plate (51A, 51B), the second conductor includes a second electrode plate (52A, 52B), and the first electrode plate (51A, 51B) and the second electrode plate (52A, 52B) form a capacitor (50/50A, 50B).

[Clause 11] A gate driver (10) that applies a drive voltage signal to a gate of a switching element (501), the gate driver, including:

a low-voltage circuit (20) configured to be actuated by application of a first voltage (V1);

a high-voltage circuit (30) configured to be actuated by application of a second voltage (V2) that is higher than the first voltage (V1); and an insulation module (80, 110), where the low-voltage circuit (20) and the high-voltage circuit (30) are connected by the insulation module (80, 110) and configured to transmit a signal through the insulation module (80, 110), and the insulation module (80, 110) includes:

a first conductor (41A, 41B/51A, 51B) and a second conductor (42A, 42B/51A, 51B) embedded in an insulation layer (85) and spaced apart and opposed to each other in a thickness-wise direction (z-direction) of the insulation layer (85);

a first electrode (81) connected to the first conductor (41A, 41B/51A, 51B);

a second electrode (82) spaced apart from the first electrode (81) as viewed in the thickness-wise direction (z-direction) of the insulation layer (85) and connected to the second conductor (42A, 42B/52A, 52B);

a passivation layer (150) disposed on a surface (85s) of the insulation layer (85) and protecting the insulation layer (85);

a low dielectric layer (160) disposed on a surface (150s) of the passivation layer (150) and having a lower permittivity than the passivation layer (150); and a mold resin (110) covering the low dielectric layer (160).

[Clause 12] The gate driver according to clause 11, where the signal includes a first signal,

the first signal output from the low-voltage circuit (20) is transmitted through the insulation module (80, 110) to the high-voltage circuit (30), and the high-voltage circuit (30) generates the drive voltage signal based on the first signal from the low-voltage circuit (20).

[Clause 13] The gate driver according to clause 12, where the signal includes a second signal, and the second signal output from the high-voltage circuit (30) is transmitted through the insulation module (80, 110) to the low-voltage circuit (20).

[Clause 14] The gate driver according to any one of clauses 1 to 13, where the insulation module (80, 110) and the low-voltage circuit (20) are mounted on a single chip.

[Clause 15] The gate driver according to any one of clauses 1 to 13, where the insulation module (80, 110) and the high-voltage circuit (30) are mounted on a single chip.

[Clause 16] The insulation module according to clause 8, where the transformer (40/40A, 40B) includes a first transformer (43A, 43B) and a second transformer (44A, 44B) that are connected in series, the first transformer (43A, 43B) is connected to the low-voltage circuit (20), and the second transformer (44A, 44B) is connected to the first transformer (43A, 43B) and the high-voltage circuit (30).

REFERENCE SIGNS LIST

10) gate driver
20) low-voltage circuit
30) high-voltage circuit
40A, 40B, 40AA, 40AB, 40BA, 40BB, 40C) transformer
41A, 41B) first coil (first conductor)
42A, 42B) second coil (second conductor)
43A, 43B) first transformer
44A, 44B) second transformer
45B, 47A, 47B) first coil (first conductor)
46A, 46B, 48A, 48B) second coil (second conductor)
80) transformer chip
50A, 50B) capacitor
51A, 51B) first electrode plate (first conductor)
52A, 52B) second electrode plate (second conductor)
81, 81A to 81F) first electrode pad (first electrode)
82, 82A to 82F) second electrode pad (second electrode)
85) insulation layer
85s) surface
110) mold resin
120, 120A, 120B) dummy pattern
150) passivation layer
150s) surface
160) low dielectric layer
160s) surface
171) first opening
172) second opening
180) resin layer
190) irregular structure
200) capacitor chip
501, 502) switching element

46

The invention claimed is:

1. An insulation module, comprising:
   a first conductor and a second conductor embedded in an insulation layer and spaced apart and opposed to each other in a thickness-wise direction of the insulation layer;
   a first electrode connected to the first conductor;
   a second electrode spaced apart from the first electrode as viewed in the thickness-wise direction of the insulation layer and connected to the second conductor;
   a passivation layer disposed on a surface of the insulation layer;
   a low dielectric layer disposed on a surface of the passivation layer and having a lower permittivity than the passivation layer; and
   a mold resin covering the low dielectric layer.

2. The insulation module according to claim 1, wherein the passivation layer is formed from a material including silicon nitride.

3. The insulation module according to claim 1, wherein the permittivity of the low dielectric layer is less than or equal to a permittivity of the mold resin.

4. The insulation module according to claim 1, wherein a thickness of the low dielectric layer is less than or equal to a thickness of the passivation layer.

5. The insulation module according to claim 1, wherein
   the passivation layer and the low dielectric layer include a first opening extending through the passivation layer and the low dielectric layer at a position overlapping with the first electrode as viewed in the thickness-wise direction of the insulation layer,
   the passivation layer and the low dielectric layer include a second opening extending through the passivation layer and the low dielectric layer at a position overlapping with the second electrode as viewed in the thickness-wise direction of the insulation layer, and
   the mold resin is in contact with the first electrode through the first opening and in contact with the second electrode through the second opening.

6. The insulation module according to claim 1, wherein
   the passivation layer includes a first opening extending through the passivation layer at a position overlapping with the first electrode as viewed in the thickness-wise direction of the insulation layer,
   the passivation layer includes a second opening extending through the passivation layer at a position overlapping with the second electrode as viewed in the thickness-wise direction of the insulation layer,
   the low dielectric layer is disposed on both a first inner surface defining the first opening and a second inner surface defining the second opening, and
   the low dielectric layer covers an end surface of the passivation layer.

7. The insulation module according to claim 1, wherein
   a resin layer is arranged on a surface of the low dielectric layer and includes a groove that exposes the surface of the low dielectric layer, and
   a region of the surface of the low dielectric layer between the first electrode and the second electrode includes an irregular structure formed by an interface between the mold resin and the resin layer and an interface between the mold resin and the low dielectric layer.

8. The insulation module according to claim 1, wherein
   the first conductor includes a first coil,
   the second conductor includes a second coil, and
   the first coil and the second coil form a transformer.

9. The insulation module according to claim 8, wherein a dummy pattern is arranged around one of the first coil and the second coil that is located closer to the passivation layer.

10. The insulation module according to claim 1, wherein the first conductor includes a first electrode plate, the second conductor includes a second electrode plate, and the first electrode plate and the second electrode plate form a capacitor.

11. The gate driver according to claim 1, wherein the insulation module and the low-voltage circuit are mounted on a single chip.

12. The gate driver according to claim 1, wherein the insulation module and the high-voltage circuit are mounted on a single chip.

13. A gate driver that applies a drive voltage signal to a gate of a switching element, the gate driver, comprising:

a low-voltage circuit configured to be actuated by application of a first voltage;

a high-voltage circuit configured to be actuated by application of a second voltage that is higher than the first voltage; and an insulation module, wherein the low-voltage circuit and the high-voltage circuit are connected by the insulation module and configured to transmit a signal through the insulation module, and the insulation module includes:

a first conductor and a second conductor embedded in an insulation layer and spaced apart and opposed to each other in a thickness-wise direction of the insulation layer;

a first electrode connected to the first conductor;

a second electrode spaced apart from the first electrode as viewed in the thickness-wise direction of the insulation layer and connected to the second conductor;

a passivation layer disposed on a surface of the insulation layer and protecting the insulation layer;

a low dielectric layer disposed on a surface of the passivation layer and having a lower permittivity than the passivation layer; and a mold resin covering the low dielectric layer.

14. The gate driver according to claim 13, wherein the signal includes a first signal, the first signal output from the low-voltage circuit is transmitted through the insulation module to the high-voltage circuit, and the high-voltage circuit generates the drive voltage signal based on the first signal from the low-voltage circuit.

15. The gate driver according to claim 14, wherein the signal includes a second signal, and the second signal output from the high-voltage circuit is transmitted through the insulation module to the low-voltage circuit.

\* \* \* \* \*